United States Patent
Yabuuchi

(10) Patent No.: US 10,541,028 B2
(45) Date of Patent: Jan. 21, 2020

(54) TERNARY CONTENT ADDRESSABLE MEMORY WIRING ARRANGEMENT

(71) Applicant: RENESAS ELECTRONICS CORPORATION, Tokyo (JP)

(72) Inventor: Makoto Yabuuchi, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 16/030,136

(22) Filed: Jul. 9, 2018

(65) Prior Publication Data

US 2019/0043582 A1 Feb. 7, 2019

(30) Foreign Application Priority Data

Aug. 7, 2017 (JP) ................. 2017-152780

(51) Int. Cl.
*G11C 15/04* (2006.01)
*H01L 23/528* (2006.01)
*H01L 23/552* (2006.01)
*H01L 27/088* (2006.01)
(Continued)

(52) U.S. Cl.
CPC ............ *G11C 15/04* (2013.01); *H01L 23/528* (2013.01); *H01L 23/552* (2013.01); *H01L 27/0886* (2013.01); *H01L 27/1052* (2013.01); *G11C 8/08* (2013.01)

(58) Field of Classification Search
CPC ....... G11C 15/04; G11C 8/08; H01L 27/1052; H01L 23/528; H01L 23/552; H01L 27/0886
See application file for complete search history.

(56) References Cited

U.S. PATENT DOCUMENTS

| 7,355,873 B2 | 4/2008 | Nii et al. |
| 9,768,179 B1* | 9/2017 | Liaw .................. H01L 27/1104 |
| 2007/0008760 A1 | 1/2007 | Nii et al. |

(Continued)

FOREIGN PATENT DOCUMENTS

JP     2007-019166 A     1/2007

OTHER PUBLICATIONS

Extended European Search Report issued in corresponding in European Patent Application No. 18183470.6-1203, dated Dec. 10, 2018.

(Continued)

*Primary Examiner* — J. H. Hur
(74) *Attorney, Agent, or Firm* — McDermott Will & Emery LLP

(57) ABSTRACT

A semiconductor storage device includes: a first memory cell joined to first and second word lines and a first match line; and a second memory cell joined to the first and second word lines and a second match line. The first and second memory cells are arranged adjacent to each other in planar view, and the first and second word lines are formed using wirings of a first wiring layer. The first and second match lines are formed using wirings of a second wiring layer provided adjacent to the first wiring layer. The first and second word lines are provided in parallel with each other between two first wirings to which a first reference potential is supplied. The first and second match lines are provided in parallel with each other between two second wirings to which the first reference potential is supplied.

9 Claims, 25 Drawing Sheets

(51) Int. Cl.
*H01L 27/105* (2006.01)
*G11C 8/08* (2006.01)

(56) References Cited

U.S. PATENT DOCUMENTS

| | | | |
|---|---|---|---|
| 2015/0200010 A1* | 7/2015 | Liaw | G11C 15/04 |
| | | | 257/390 |
| 2016/0247569 A1 | 8/2016 | Nii | |
| 2018/0068708 A1* | 3/2018 | Nii | G11C 15/04 |

OTHER PUBLICATIONS

Y. Tsukamoto et al., "1.8Mbit/mm2 Ternary-CAM macro with 484 ps Search Access Time in 16 nm Fin-FET Bulk CMOS Technology", 2015 Symposium on VLSI Circuits Digest of Technical Papers, pp. 274-275.

* cited by examiner

| 11(MCX) | 12(MCY) | TCAM CELL DATA |
|---|---|---|
| "1" | "0" | "0" |
| "0" | "1" | "1" |
| "0" | "0" | "x" (don't care) |
| "1" | "1" | NOT USED |

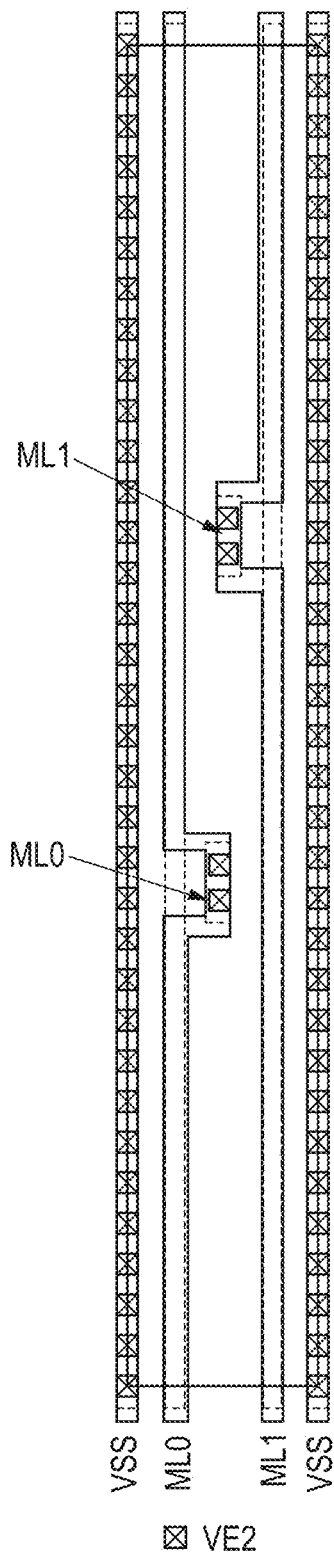
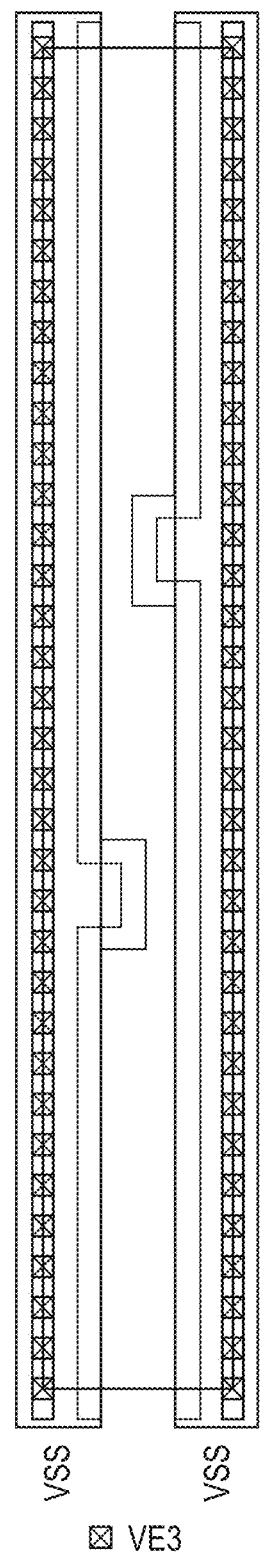
FIG. 8
FIG. 9

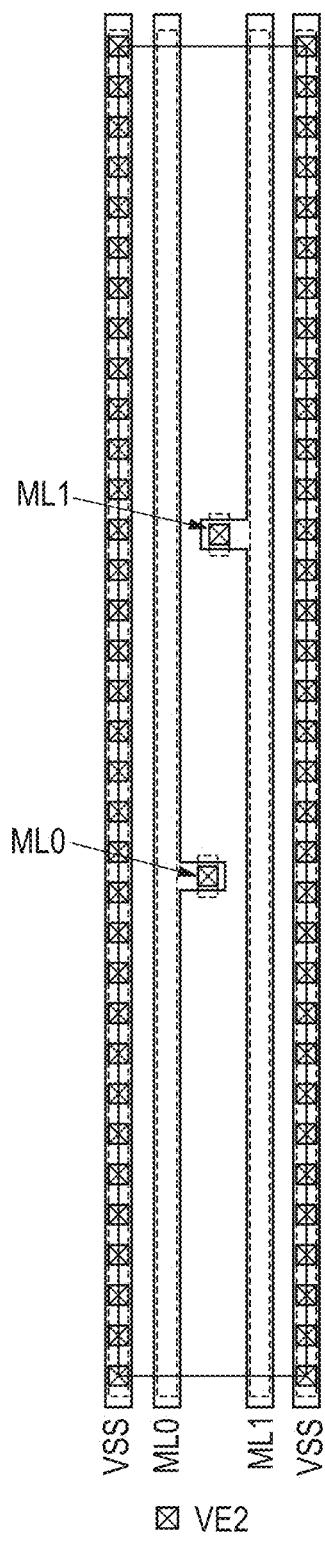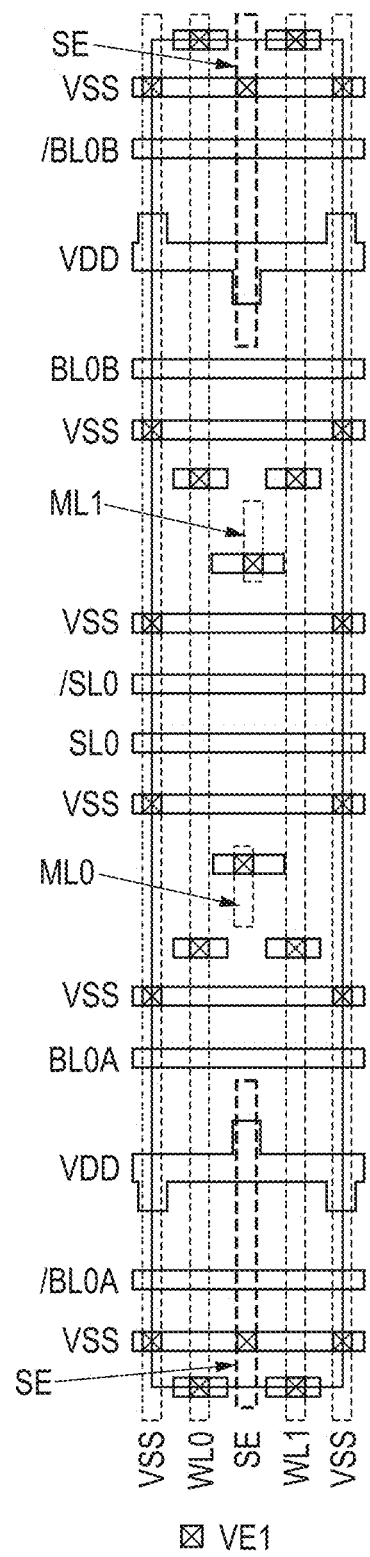
FIG. 10
FIG. 11

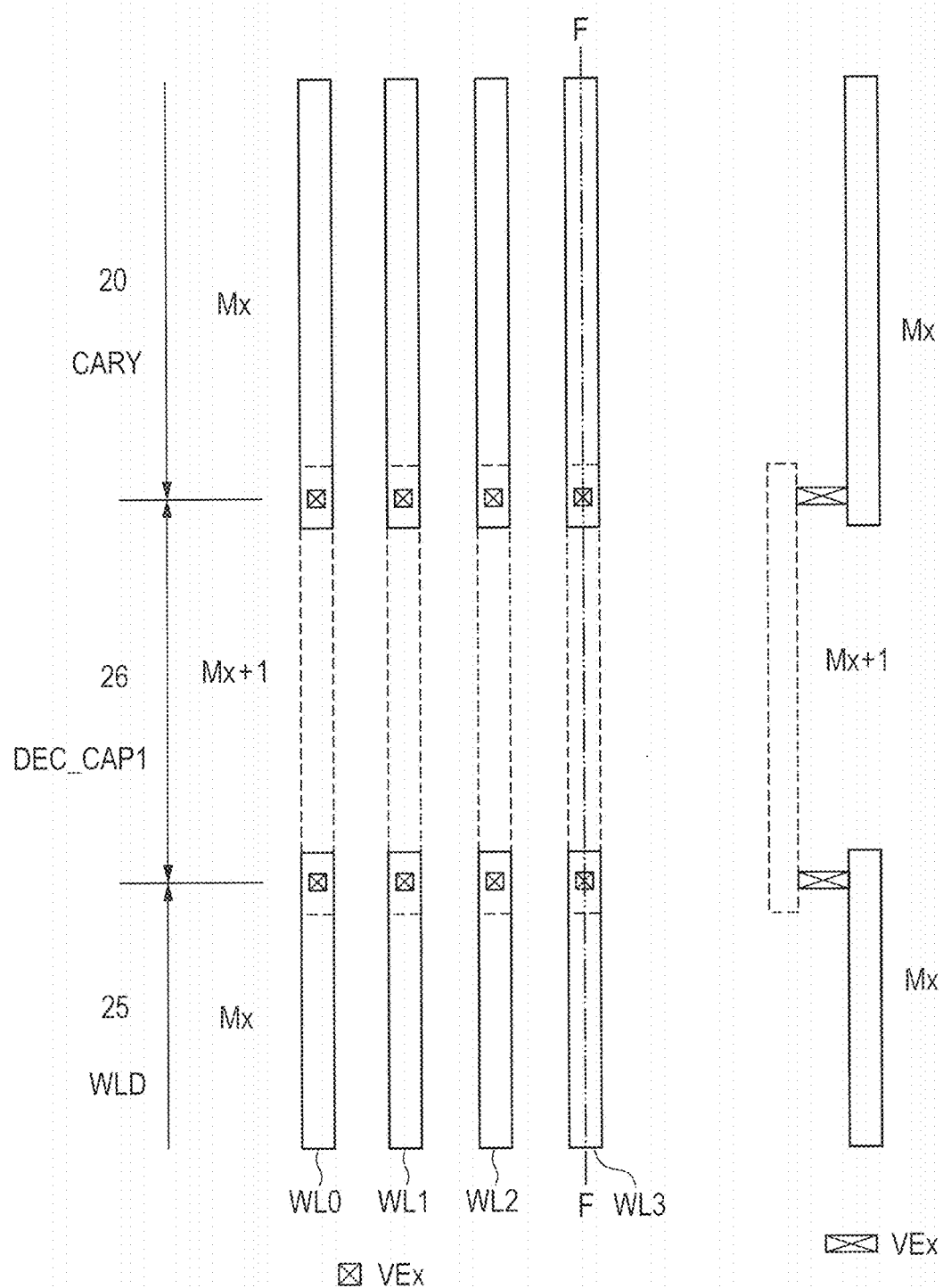

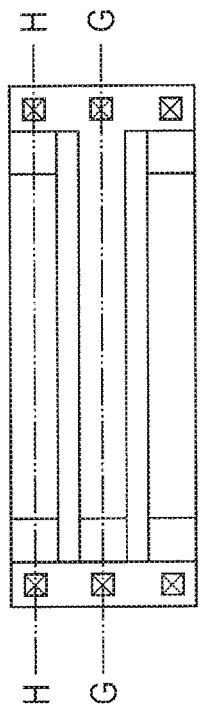
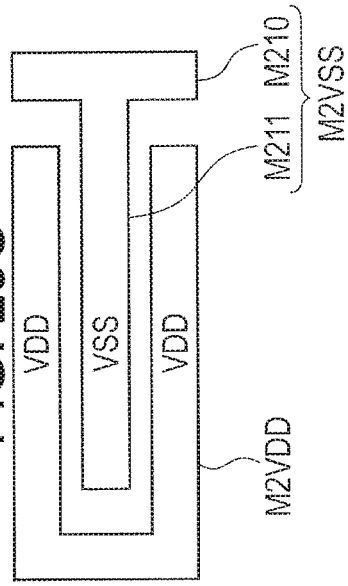
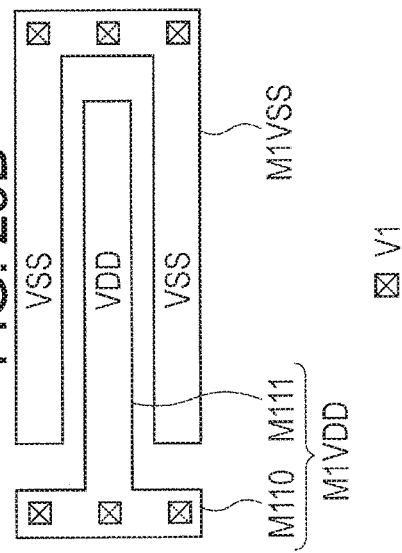

(1)

TERNARY CONTENT ADDRESSABLE MEMORY WIRING ARRANGEMENT

CROSS-REFERENCE TO RELATED APPLICATIONS

The disclosure of Japanese Patent Application No. 2017-152780 filed on Aug. 7, 2017 including the specification, drawings and abstract is incorporated herein by reference in its entirety.

BACKGROUND

The disclosure relates to a semiconductor storage device, and can be particularly applied to a content addressable memory that can be incorporated into a semiconductor device and a semiconductor device including a content addressable memory.

A data word (entry) matching a search word (search data) is searched for among those stored in a semiconductor storage device called an associative memory or a CAM (Content Addressable Memory). In the case where the word data matching the search word can be found, the address thereof is output.

As the CAM, there are a BCAM (Binary CAM) and a TCAM (Ternary CAM). Each memory cell of the BCAM stores information of either "0" or "1". On the other hand, each memory cell of the TCAM can store information of not only "0" and "1" but also "Don't Care". The "Don't Care" indicates that either of "0" and "1" may be stored.

In recent years, a TCAM device using the TCAM has been widely used for address search and access control in a router for a network such as the Internet.

A second embodiment of Japanese Unexamined Patent Application Publication No. 2007-19166 discloses a technique in which two memory cells share a search line.

SUMMARY

There is a demand for large memory capacity in a TCAM incorporated in a semiconductor device. Therefore, it is necessary to provide a highly-integrated and large-capacity TCAM by decreasing the area of the layout of memory cells of the TCAM. Further, the TCAM consumes a large amount of current at the time of a search operation. The current flows into VSS wirings to which a ground potential VSS in the memory cell is supplied. Thus, there is an object of decreasing a potential fluctuation (IR drop) due to the parasitic resistance value of the VSS wirings.

An object of the disclosure is to provide a semiconductor storage device which can be highly integrated and whose potential fluctuation (IR drop) due to the parasitic resistance value of VSS wirings is decreased.

The other objects and novel features will become apparent from the description of the specification and the accompanying drawings.

The following is a representative summary of the disclosure.

Namely, a semiconductor storage device includes: a first word line; a second word line; a first match line; a second match line; a first memory cell joined to the first word line, the second word line, and the first match line; and a second memory cell joined to the first word line, the second word line, and the second match line. The first memory cell and the second memory cell are arranged adjacent to each other in planar view, and the first word line and the second word line are formed using wirings of a first wiring layer. The first match line and the second match line are formed using wirings of a second wiring layer provided adjacent to the first wiring layer. The first word line and the second word line are provided in parallel with each other between two first wirings to which a first reference potential is supplied. The first match line and the second match line are provided in parallel with each other between two second wirings to which the first reference potential is supplied.

According to the above-described semiconductor storage device, it is possible to highly integrate and to decrease a potential fluctuation (IR drop) due to the parasitic resistance value of VSS wirings.

BRIEF DESCRIPTION OF THE DRAWINGS

FIG. 8 is a diagram for showing a coupling relation between the wirings (VSS, ML0, and ML1) of the second wiring layer shown in FIG. 7 and the wirings (VSS, ML0, and ML1) of a third wiring layer;

FIG. 9 is a diagram for showing a coupling relation between the wirings (VSS, ML0, and ML1) of the third wiring layer shown in FIG. 8 and the wirings (VSS) of a fourth wiring layer;

FIG. 10 is a diagram for showing a modified example of the match lines ML0 and ML1 of FIG. 8;

FIG. 11 shows a modified example of FIG. 7 and is diagram in which a shield wiring is provided;

FIG. 14 and FIGS. 16 to 19 are overlapped with each other;

FIG. 14 and FIGS. 16 to 19 are overlapped with each other;

FIG. 14 and FIGS. 16 to 19 are overlapped with each other;

FIG. 14 and FIGS. 16 to 19 are overlapped with each other;

FIG. 26 is a diagram for showing a layout configuration of the word lines according to FIG. 24;

FIG. 27 is a cross-sectional view taken along the line F-F of FIG. 26;

FIG. 29 is a diagram of a configuration example of a capacitance element using an MIM capacitance in which FIG. 29A shows a plan view of an MIM capacitance element configured by overlapping FIG. 29B and FIG. 29C with each other, FIG. 29B is a layout arrangement diagram of the first wiring layer, and FIG. 29C is a layout arrangement diagram of the second wiring layer;

DETAILED DESCRIPTION

Figure 1:
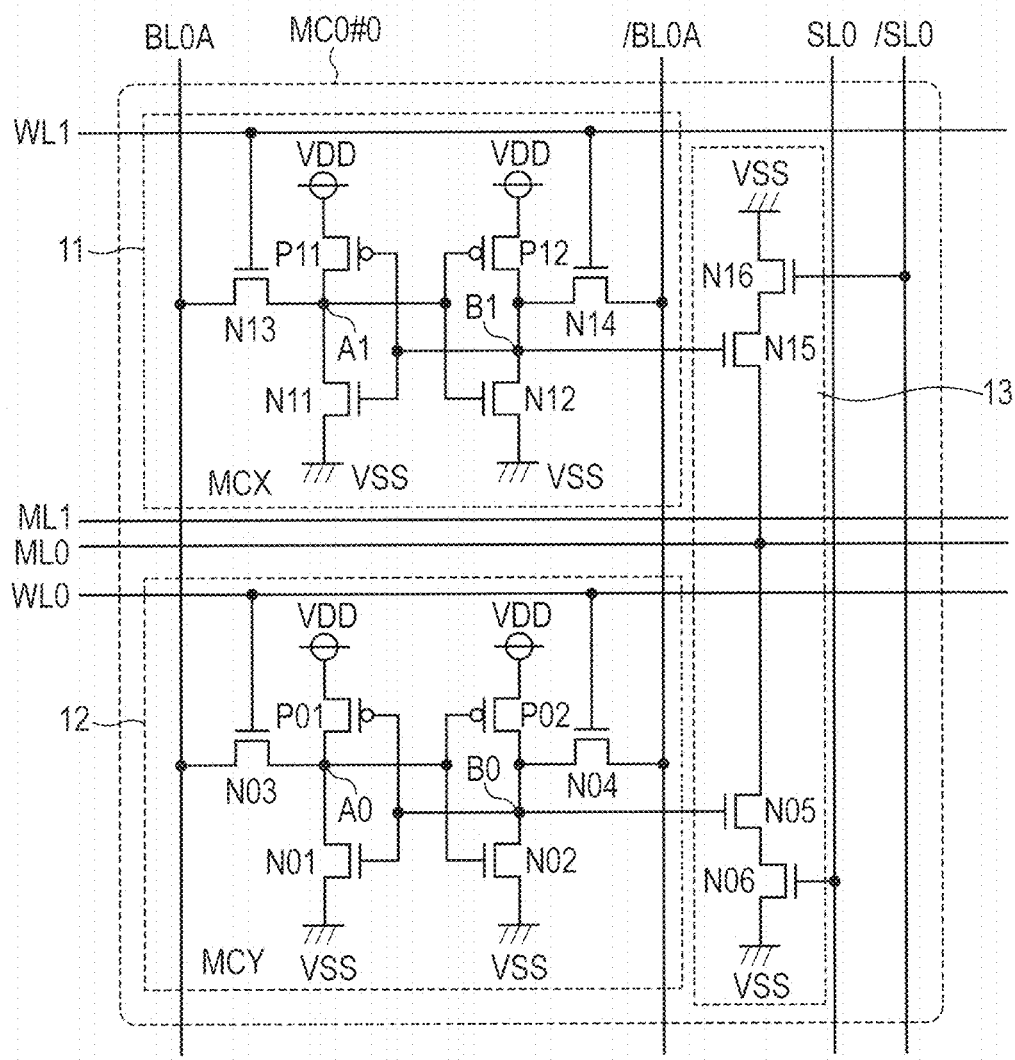
FIG. 1 is a circuit diagram for showing an example of a configuration of a TCAM cell according to an example.

Hereinafter, an example and modified examples will be described using the drawings. However, the same constitutional elements are followed by the same signs in the following description, and the repeated explanation thereof will be occasionally omitted. It should be noted that the width, thickness, shape, and the like of each unit are schematically shown in the drawings in some cases as compared to the actual mode in order to more clarify the explanation. However, these are only examples, and do not limit the interpretation of the present invention.

Example

[Configuration of TCAM Cell]

FIG. 1 is a circuit diagram for showing an example of a configuration of a TCAM cell according to an example. With reference to FIG. 1, a TCAM cell MC0#0 (also referred to as a memory cell) includes two SRAM cells (Static Random Access Memory Cells) 11 and 12 and a data comparison unit 13. The SRAM cell 11 is also referred to as an MCX cell, and the SRAM cell 12 is also referred to an MCY cell. The MCX cell 11 stores pieces of 1-bit complementary data (when one data is "1", the other is "0") in a pair of storage nodes A1 and B1 inside the MCX cell 11. The MCY cell 12 stores pieces of 1-bit complementary data in a pair of storage nodes A0 and B0 inside the MCY cell 12.

The TCAM cell is coupled to a pair of bit lines BL0 and/BL0, a pair of search lines SL0 and/SL0, a match line ML0, and word lines WL0 and WL1. The pair of bit lines BL0 and/BL0 extends in the column direction (Y direction) of a TCAM cell array 20 of FIG. 5, and is shared by a plurality of TCAM cells arrayed in the column direction. The pair of search lines SL0 and/SL0 extends in the column direction (Y direction) of the TCAM cell array 20, and is shared by the TCAM cells arrayed in the column direction.

The match line ML extends in the row direction (X direction) of the TCAM cell array 20, and is shared by the TCAM cells arrayed in the row direction. The word lines WL0 and WL1 extend in the row direction (X direction) of the TCAM cell array 20, and is shared by the TCAM cells arrayed in the row direction. The word lines WL0 and WL1 can be also referred to as a first word line and a second word line.

The MCX cell 11 includes a P-channel MOS (Metal Oxide Semiconductor) transistor P12 and an N-channel MOS (Metal Oxide Semiconductor) transistor N12 configuring an inverter INV1, a P-channel MOS transistor P11 and an N-channel MOS transistor N11 configuring an inverter INV2, and N-channel MOS transistors N13 and N14.

The inverter INV1 is coupled between the storage node A1 and the storage node B1 so that the direction from the storage node A1 to the storage node B1 becomes the forward direction. The inverter INV2 is coupled in parallel with and in the backward direction of the inverter INV1, and is coupled between the storage node A1 and the storage node B1 so that the direction from the storage node B1 to the storage node A1 becomes the forward direction. Namely, the gate, source, and drain of the transistor P11 are joined to the storage node B1, a power supply potential node VDD serving as a first reference potential, and the storage node A1, respectively. The gate, source, and drain of the transistor N11 are joined to the storage node B1, a ground potential node VSS serving as a second reference potential, and the storage node A1, respectively. The gate, source, and drain of the transistor P12 are joined to the storage node A1, the power supply potential node VDD, and the storage node B1, respectively. The gate, source, and drain of the transistor N12 are joined to the storage node A1, the ground potential node VSS, and the storage node B1, respectively.

The transistor N14 is coupled between the storage node B1 and the bit line/BL0. The transistor N13 is coupled between the storage node A1 and the bit line BL0. Each of the gates of the MOS transistors N14 and N13 is coupled to the word line WL1.

The MCY cell 12 includes a P-channel MOS transistor P02 and an N-channel MOS transistor N02 configuring an inverter INV3, a P-channel MOS transistor P01 and an N-channel MOS transistor N01 configuring an inverter INV4, and N-channel MOS transistors N03 and N04.

The inverter INV3 is coupled between the storage node A0 and the storage node B0 so that the direction from the storage node A0 to the storage node B0 becomes the forward direction. The inverter INV4 is coupled in parallel with and in the backward direction of the inverter INV3, and is coupled between the storage node A0 and the storage node B0 so that the direction from the storage node B0 to the storage node A0 becomes the forward direction. Namely, the gate, source, and drain of the transistor P01 are joined to the storage node B0, the power supply potential node VDD, and the storage node A0, respectively. The gate, source, and drain of the transistor N01 are joined to the storage node B0, the ground potential node VSS, and the storage node A0, respectively. The gate, source, and drain of the transistor P02 are joined to the storage node A0, the power supply potential node VDD, and the storage node B0, respectively. The gate, source, and drain of the transistor N02 are joined to the storage node A0, the ground potential node VSS, and the storage node B0, respectively.

The transistor N04 is coupled between the storage node B0 and the bit line/BL0. The transistor N03 is coupled between the storage node A0 and the bit line BL0. Each of the gates of the transistors N03 and N04 is coupled to the word line WL0.

The data comparison unit 13 includes N-channel MOS transistors N15, N16, N06, and N05. The transistors N15 and N16 are coupled in series between the match line ML0 and the ground potential node VSS. The transistors N06 and N05 are coupled in series between the match line ML0 and the ground potential node VSS, and are coupled in parallel with the entirety of the transistors N15 and N16 that are coupled in series. The gates of the transistors N15 and N05 are coupled to the storage nodes B1 and B0, respectively. The gates of the transistors N16 and N06 are coupled to the search lines SL0 and/SL0, respectively.

Figures 2, 3:
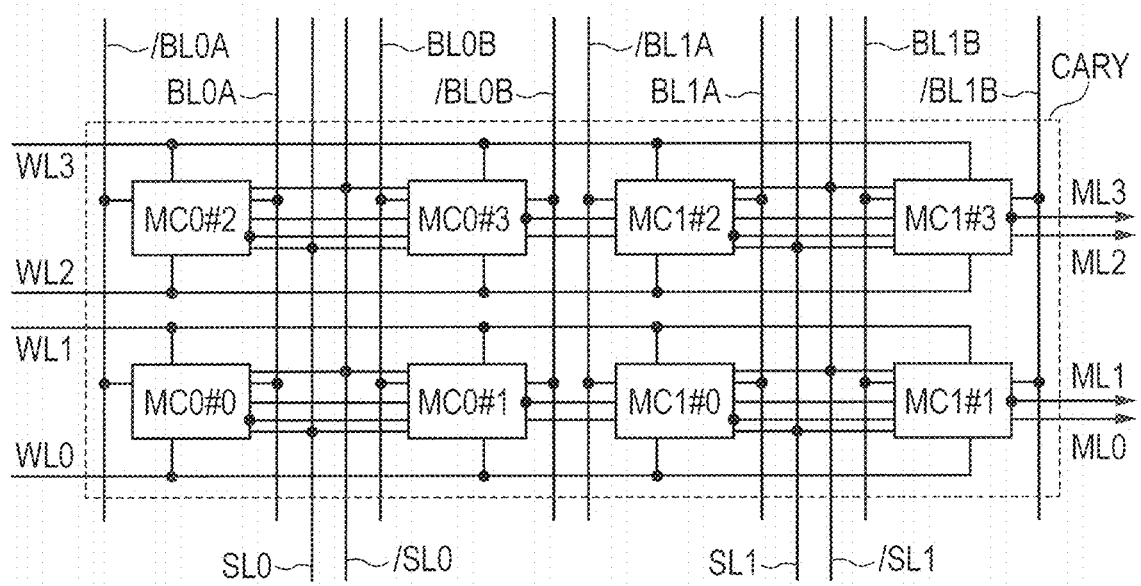
FIG. 2 is a diagram for showing correspondences between contents stored in an MCX cell and an MCY cell of FIG. 1 and data of the TCAM cell in a table format.
FIG. 3 is a diagram for showing a configuration example of a memory array according to the example.

FIG. 2 is a diagram for showing correspondences between the contents stored in the MCX cell and the MCY cell of FIG. 1 and the data of the TCAM cell in a table format.

With reference to FIG. 1 and FIG. 2, the TCAM cell can store three kinds of values such as "0", "1", and "x" (don't care) using the 2-bit SRAM cell. Specifically, it is assumed that when "1" is stored in the storage node B1 of the MCX cell 11 and "0" is stored in the storage node B0 of the MCY cell 12, "0" is stored in the TCAM cell. It is assumed that when "0" is stored in the storage node B1 of the MCX cell 11 and "1" is stored in the storage node B0 of the MCY cell 12, "1" is stored in the TCAM cell. It is assumed that when "0" is stored in the storage node B1 of the MCX cell 11 and "0" is stored in the storage node B0 of the MCY cell 12, "x" (don't care) is stored in the TCAM cell. In the case where "1" is stored in the storage node B1 of the MCX cell 11 and "1" is stored in the storage node B0 of the MCY cell 12, the TCAM cell is not used.

According to the configuration of the above-described TCAM cell, in the case where the search data is "1" (namely, the search line SL0 is "1" and the search line/SL0 is "0") and the TCAM data is "0" (the storage node B1 is "1" and the storage node B0 is "0"), the transistors N15 and N16 are turned on. Thus, the potential of the precharged match line ML0 is extracted to the ground potential VSS. In the case where the search data is "0" (namely, the search line SL0 is "0" and the search line/SL0 is "1") and the TCAM data is "1" (the storage node B1 is "0" and the storage node B0 is "1"), the MOS transistors N05 and N06 are turned on. Thus, the potential of the precharged match line ML0 is extracted to the ground potential VSS. Namely, in the case where the search data and the TCAM data do not match each other, the potential of the match line ML is extracted to the ground potential VSS.

On the contrary, in the case where the input search data is "1" and the TCAM data is "1" or "x", or in the case where the search data is "0" and the TCAM data is "0" or "X" (namely, in the case where the both match each other), the potential (the level of the power supply potential VDD) of the precharged match line ML0 is kept.

As described above, in the case of the TCAM, the charge accumulated in the match line ML0 is extracted unless the data of all the TCAM cells coupled to the match line ML0 corresponding to one entry (row) matches the input search data.

[Configuration of Memory Array]

Figure 4:
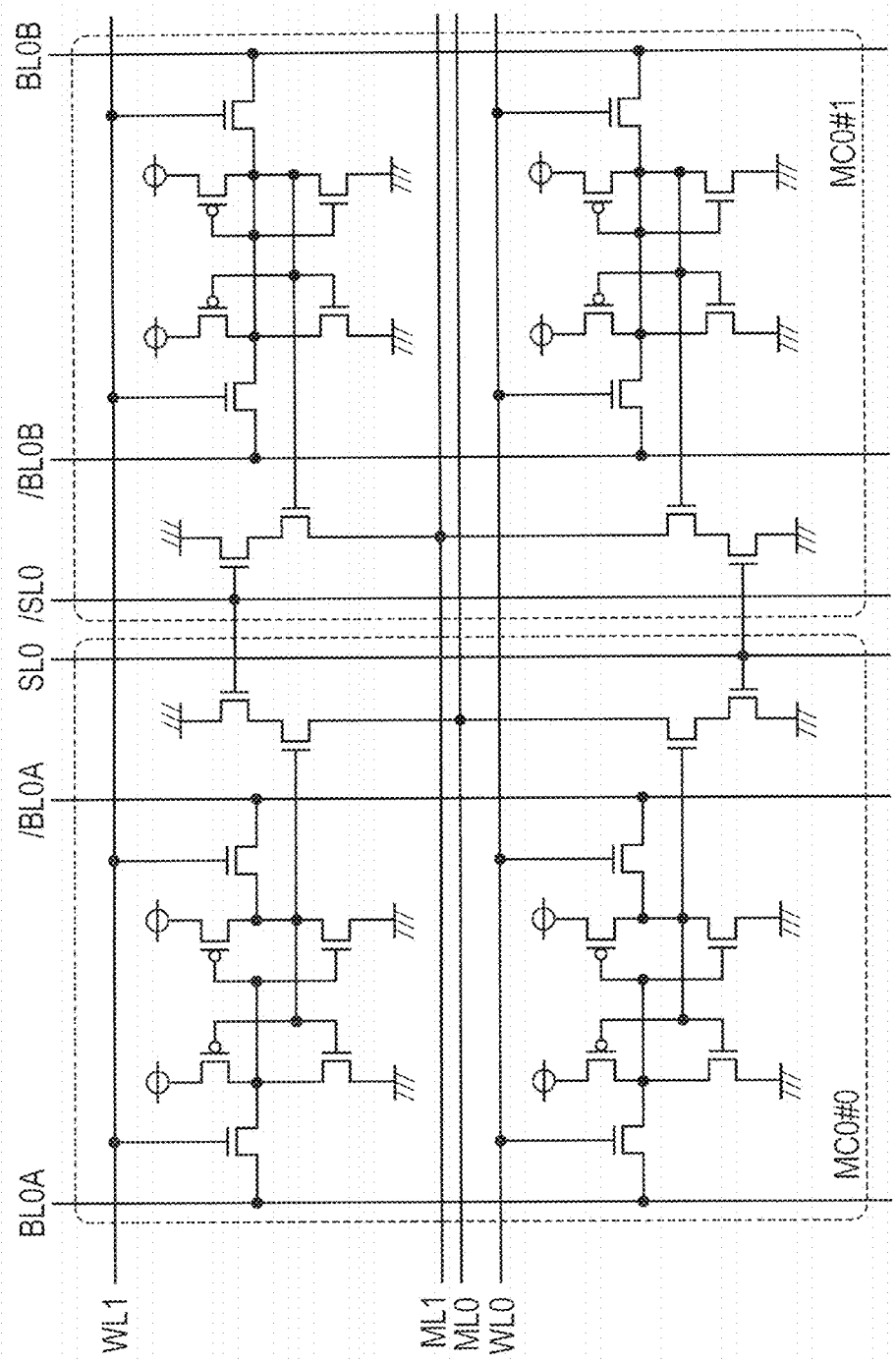
FIG. 4 is a circuit diagram for showing memory cells MC0#0 and MC0#1 adjacent to each other in the memory array CARY of FIG. 3.

FIG. 3 is a diagram for showing a configuration example of a memory array according to the example. FIG. 4 is a circuit diagram for showing memory cells MC0#0 and MC0#1 adjacent to each other in the memory array CARY of FIG. 3.

In this example, two-row and four-column TCAM cells are arranged in the memory array CARY. The memory cell MC0#0 shown in FIG. 1 is used for each TCAM cell. Addresses #0 and #1 are assigned to the lower first row, and addresses #2 and #3 are assigned to the upper second row. In each row, the addresses of the memory cells adjacent in the row direction are different from each other.

On the other hand, two match lines are arranged for the TCAM cells that are physically arranged in four cells of one row. Specifically, the match lines ML0 and ML1 are arranged for the memory cells in the first row. Of these lines, the match line ML0 is coupled to the memory cells MC0#0 and MC1#0 associated with the address #0. Further, the match line ML1 is coupled to the memory cells MC0#1 and MC1#1 associated with the address #1.

Further, the match lines ML2 and ML3 are arranged for the memory cells in the second row. Of these lines, the match line ML2 is coupled to the memory cells MC0#2 and MC1#2 associated with the address #2. Further, the match line ML3 is coupled to the memory cells MC0#3 and MC1#3 associated with the address #2.

As described above, the example is configured in such a manner that the memory cells are alternately coupled in units of two cells through the match lines in each row. Namely, two pairs of search lines SL0 and/SL0 and SL1 and/SL1 are arranged, and four match lines ML0 to ML3 are arranged.

In FIG. 3, the word lines for two cells of the memory cell MC0#0 and the memory cell MC0#1 are arranged in a shared manner, and the pair of bit lines is separately arranged. Thus, the data of two cells can be simultaneously read or written.

Accordingly, since data can be simultaneously written or read into/from two addresses in one cycle, the number of cycles of writing data can be advantageously reduced. In addition, since the length of each search line is short, the wiring capacity can be suppressed. Thereby, high speeds and low power consumption can be realized.

As shown in FIG. 4, the pair of search lines SL0 and/SL0 is shared by the memory cells MC0#0 and MC0#1 adjacent to each other and the memory cells MC0#2 and MC0#3 adjacent to each other. Further, the pair of search lines SL1 and/SL1 is shared by the memory cells MC1#0 and MC1#1 adjacent to each other and the memory cells MC1#2 and MC1#3 adjacent to each other. The area of the memory array CARY can be reduced by employing such a configuration. Thereby, the memory array CARY can be incorporated into a semiconductor device of a large-capacity content address-able memory (TCAM device).

[Operation of Memory Array]

An operation of the memory cells will be described in more detail with reference to FIG. 3 and FIG. 4.

First, in the case where data is simultaneously written into the MCY cells having the addresses #0 and #1, the word line WL0 is activated into the H level, and the word line WL1 is inactivated into the L level. The word lines WL2 to WL3 are inactivated into the L level because the addresses are different from each other.

Then, the bit line BL0A is set to a level corresponding to data D0#0 of the 0-th bit written into the address #0, and the bit line/BL0A is set to the inverted level. The bit line BL0B is set to a level corresponding to data D0#1 of the 0-th bit written into the address #1, and the bit line/BL0B is set to the inverted level.

Further, the bit line BL1A is set to a level corresponding to data D1#0 of the first bit written into the address #0, and the bit line/BL1A is set to the inverted level. The bit line BL1B is set to a level corresponding to data D1#1 of the first bit written into the address #1, and the bit line/BL1B is set to the inverted level.

All the pairs of search lines SL0 and/SL0 and SL1 and/SL1 are inactivated into the L level when writing data. Then, although the level may be the H level or L level, the match line ML is preferably held in a state of being precharged to the H level.

Next, a case in which data is simultaneously written into the MCX cells having the addresses #0 and #1 will be described. In this case, the word line WL0 is inactivated into the L level, and the word line WL1 is activated into the H level. Since data is not to be written into the addresses, the word lines WL2 to WL3 are inactivated into the L level.

At this time, the bit line BL0A is set to a level corresponding to data MD0#0 that is 0-th bit data written into the address #0, and the bit line/BL0A is set to the inverted level. The bit line BL0B is set to a level corresponding to data MD0#1 that is 0-th bit data written into the address #1, and the bit line/BL0B is set to the inverted level.

Further, the bit line BL1A is set to a level corresponding to data MD1#0 that is first bit data written into the address #0, and the bit line/BL1A is set to the inverted level. The bit line BL1B is set to a level corresponding to data MD1#1 that is first bit mask data written into the address #1, and the bit line/BL1B is set to the inverted level.

At this time, the search lines SL0, /SL0, SL1, and/SL1 are inactivated into the L level. Although the level may be the H level or L level, the match line ML is preferably precharged to the H level.

On the contrary, data of all the memory cells of the memory array MA1 is compared when searching data. At this time, all the word lines WL0 to WL3 are inactivated into the L level. Although the level may be the H level or L level, all the bit lines BL0A, BL0B, BL1A, BL1B, /BL0A, /BL0B, /BL1A, and/BL1B are preferably in a state of being precharged to the H level.

At this time, the search line SL0 is set to a level corresponding to data SD0 of the 0-th bit of the search data, and the search line/SL0 is set to the inverted level. Further, the search line SL1 is set to a level corresponding to data SD1 of the first bit of the search data, and the search line/SL1 is set to the inverted level.

Then, in the case where all the pieces of search data match each other at the corresponding addresses, the match line ML becomes the H level. In the case where mismatch occurs at any one of the corresponding addresses, the charge of the precharged match line is extracted, and the match line outputs the L level as an output signal OUT.

[Block Configuration of Content Addressable Memory (TCAM Device)]

Figure 5:
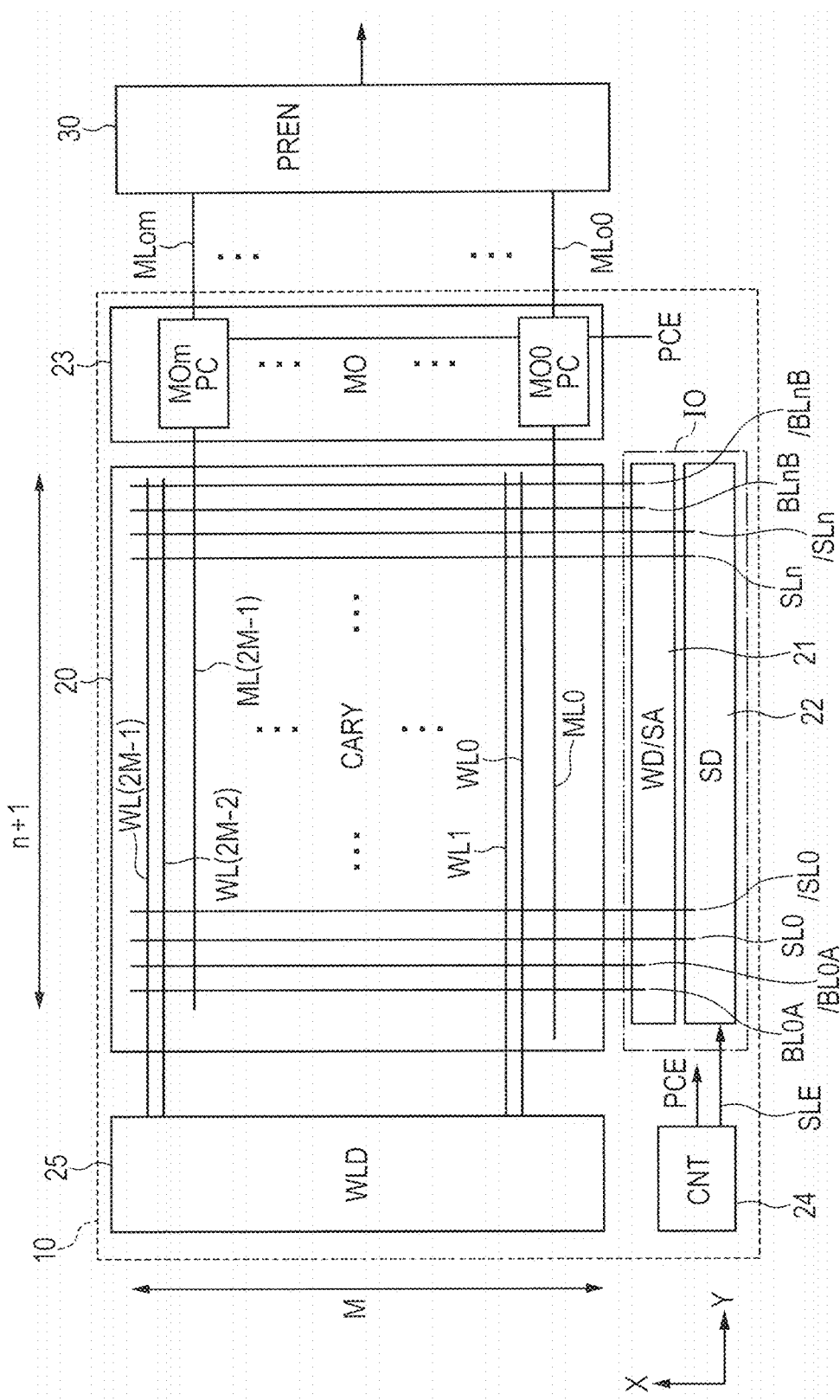
FIG. 5 shows a conceptual block diagram of a content addressable memory (TCAM device) according to the example.

FIG. 5 shows a conceptual block diagram of a content addressable memory (TCAM device) according to the example. A memory array CARY of FIG. 5 is obtained by extending the two-row and four-column memory array CARY described in FIG. 3 to an (M+1)-row and (n+1)-column memory array CARY. It should be noted that the memory cells (MC0#0, MC0#1, MC0#2, MC0#3, and the like) are not illustrated in FIG. 5 to avoid the complexity of the drawing.

A TCAM device 1 is incorporated into a semiconductor device formed on a semiconductor substrate such as, for example, monocrystal silicon. The TCAM device 1 includes a TCAM macro cell 10 and a priority encoder (PREN) 30.

The TCAM macro cell 10 includes a TCAM cell array (CARY) 20 (also simply referred to as a cell array), an input/output circuit unit IO having a writing driver and reading sense amplifier (WD/SA) 21 and a search line driver (SD) 22, a match line output circuit unit (MO) 23, a control logic circuit (CNT) 24, and a formation area 25 for a word line driver (WLD) to drive the word lines WL0 to WL (2M−1). It should be noted that the word line driver (WLD) is represented as 25 in some cases in the following description.

The cell array 20 includes the TCAM cells arrayed in a matrix manner (M rows; n+1 columns). In the cell array 20, the number of rows is M (M is a positive integer), and the number of columns is n+1 (n is a positive integer).

n+1 pairs of bit lines (BL0A, /BL0A-BLnB, /BLnB) and n+1 pairs of search lines (SL0, /SL0-SLn, /SLn) are provided while corresponding to the respective columns of the cell array 20. 2M match lines (ML0, ML1-ML(2M−2), ML(2M−1)), M word lines (WL1-WL(2M−1)) for the X cell, and M word lines (WL0-WL(2M−2)) for the Y cell are provided while corresponding to the respective rows of the cell array 20.

The writing driver and reading sense amplifier 21 includes a writing driver WD and a reading sense amplifier SA. The writing driver WD supplies writing data to each TCAM cell through the pairs of bit lines (BL0A, /BL0A-BLnB, /BLnB) at the time of writing. The reading sense amplifier SA amplifies and outputs data read from each TCAM cell through the pairs of bit lines (BL0A, /BL0A-BLnB, /BLnB) at the time of reading.

The search line driver 22 supplies search data to each TCAM cell through the pairs of search lines (SL0, /SL0-SLn, /SLn) at the time of searching.

The control logic circuit (CNT) 24 controls the operation of the entire TACM macro cell 10. For example, the control logic circuit 24 controls the operations of the search line driver (SD) 22, the match line output circuit unit (MO) 23, and a precharge circuit PC at the time of searching by receiving a search command and outputting a control signal to the search line driver 22 and a match amplifying unit 23. The control logic circuit 24 controls the operations of the writing driver WD and the word line driver (WLD) 25 at the time of writing by outputting a control signal to the writing driver WD and the word line driver (WLD) 25. Further, the control logic circuit 24 controls the operations of the word line driver (WLD) 25 and the reading sense amplifier SA at the time of reading by outputting a control signal to the word line driver (WLD) 25 and the reading sense amplifier SA.

The control logic circuit 24 outputs a precharge enable signal PCE for instructing to precharge to the precharge circuit PC to be described later, and outputs a search line enable signal SLE for instructing to perform a search operation or a search access operation to the search line driver 22.

The match line output circuit unit (MO) 23 has a plurality of match line output circuits MO0-M0m. The respective inputs of the match line output circuits MO0-MOm are coupled to the corresponding match lines ML (ML0, ML1-ML(2M−2), ML(2M−1)), and the respective outputs of the match line output circuits MO0-Mom are coupled to corresponding match signal output lines MLo (MLo0-MLom). At the time of searching, the match line output circuits MO0-Mom generate a detection signal to detect whether or not the corresponding TCAM cell data matches the corresponding part of the input search data on the basis of the potential of the corresponding match lines ML ((ML0, ML1-ML(2M−2), ML(2M−1)), and output the same to the corresponding match signal output lines MLo (MLo0-MLom). In this example, each of the match line output circuits MO0-Mom includes the precharge circuit PC to set the corresponding match lines ML[0]-ML[M] to the precharge potential at the time of searching.

The priority encoder (PREN) 30 is provided to select one match signal output line in accordance with a predetermined priority in the case where some of the match signal output lines MLo0-MLom are at a signal level that indicates matching at the time of searching in the normal operation.

Configuration Example 1 of TCAM Cell

FIG. 6 to FIG. 9 are outline plan views each showing the TCAM cell according to the example while dividing the planar layout configuration thereof in the laminating direction.

Figure 6:
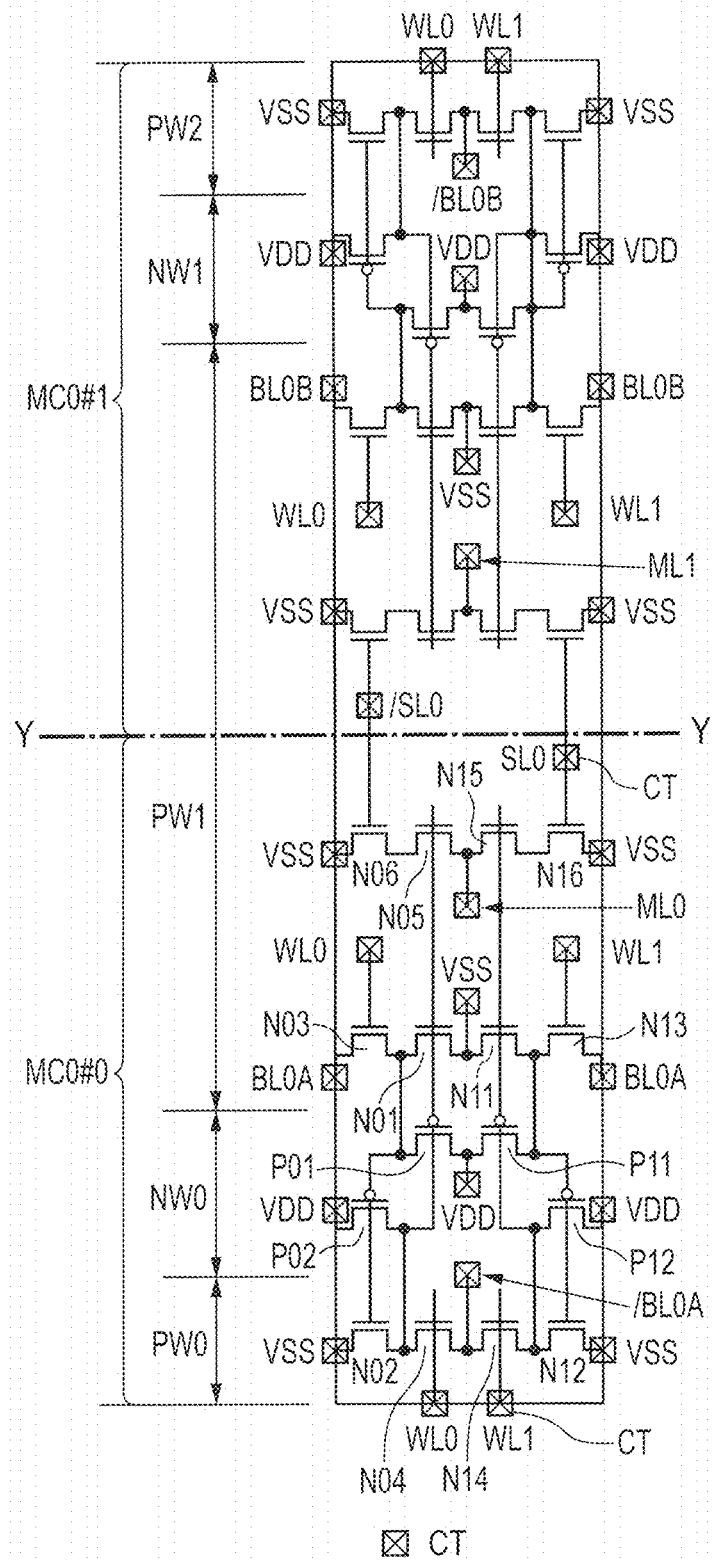
FIG. 6 conceptually shows a cell layout of the memory cells MC0#0 and MC0#1 shown in FIG. 4.

FIG. 6 conceptually shows a cell layout of the memory cells MC0#0 and MC0#1 shown in FIG. 4. FIG. 6 shows a layout of each transistor configuring the memory cells MC0#0 and MC0#1, each wiring coupled to the memory cells, and contacts CT serving as coupling parts. The wirings are a first power supply wiring VDD, a second power supply wiring VSS, the word lines WL0 and WL1, the bit lines BL0A, /BL01A, BL0B, and/BL0B, the search lines SL0 and/SL0, and the match lines ML0 and ML1.

As shown in FIG. 6, the transistors configuring the memory cell MC0#0 and the transistors configuring the memory cell MC0#1 are arranged while being linearly symmetrical with the Y-Y line. Then, while the long rectangular cell layout shown in FIG. 6 is used as one unit, the memory array (CARY) 20 is configured by arranging the units in a matrix manner. As described in FIG. 1, the memory cell MC0#0 is configured using the transistors (N01-N06, P01, P02, N11-N06, P11, and P12). Although not illustrated in FIG. 6, the memory cell MC0#1 also has transistors similar to those (N01-N06, P01, P02, N11-N06, P11, and P12) configuring the memory cell MC0#0.

In this example, the memory cells MC0#0 and MC0#1 are configured in a P-type well area PW0, an N-type well area NW0, a P-type area well PW1, an N-type area well NW1, and a P-type area well PW2 formed on the main surface of a semiconductor substrate such as monocrystal silicon by using a well-known manufacturing method of MOS transistors. Namely, in this example, the memory cells MC0#0 and MC0#1 are configured using planar-type MOS transistors, and are arranged adjacent to each other on the main surface of the semiconductor substrate.

The transistors N02, N04, N14, and N12 of the memory cell MC0#0 are formed in the P-type well area PW0. The transistors P01, P02, P11, and P12 of the memory cell MC0#0 are formed in the N-type well area NW0. The transistors N01, N03, N05, N06, N11, N13, N15, and N16 of the memory cell MC0#0 are formed in a part where the memory cell MC0#0 of the P-type area well PW1 is formed. The transistors configuring the memory cell MC0#1 are also formed in the P-type area well PW1, the N-type area well NW1, and the P-type area well PW2 as similar to those configuring the memory cell MC0#0.

It should be noted that although not illustrated in the drawing, the N-channel MOS transistors have gates such as polycrystalline silicon formed through an insulating film on an N-type source area, an N-type drain area, and the semiconductor substrate between the N-type source area and the N-type drain area. As similar to the above, the P-channel MOS transistors have gates such as polycrystalline silicon formed through an insulating film on a P-type source area, a P-type drain area, and the semiconductor substrate between the P-type source area and the P-type drain area.

Figure 7:
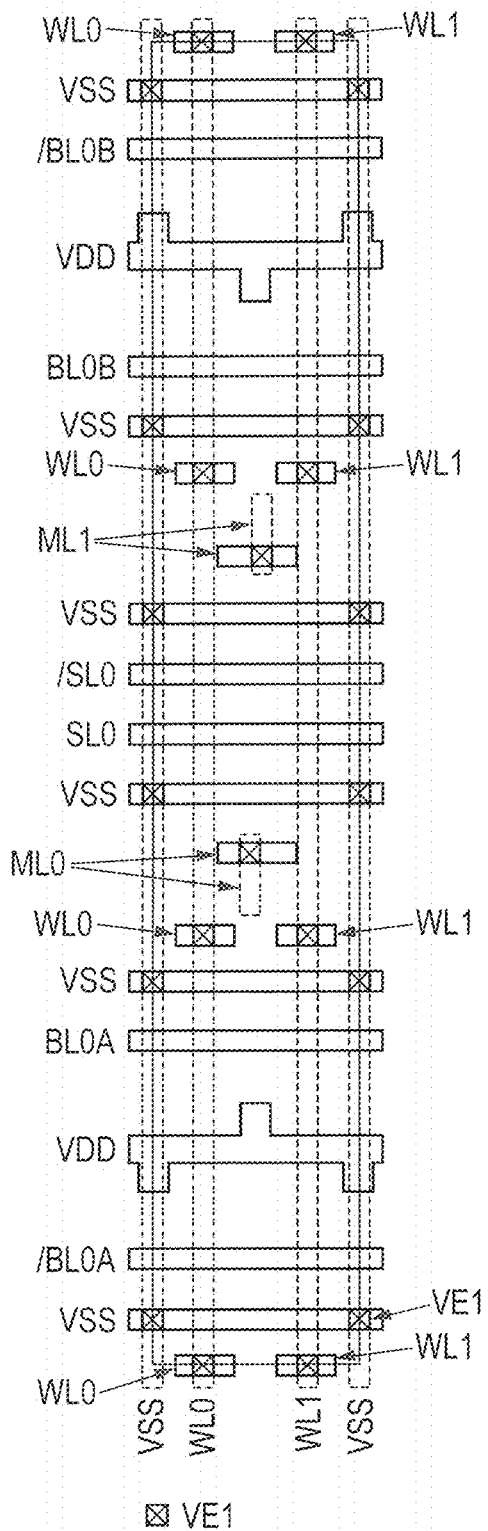
FIG. 7 is a diagram for showing each wiring of a first wiring layer, each wiring of a second wiring layer, a via electrode serving as a coupling part.

FIG. 7 is a diagram for showing each wiring of a first wiring layer, each wiring of a second wiring layer, a via electrode serving as a coupling part. It should be noted that the first wiring layer and the second wiring layer neither mean a wiring layer firstly provided in the semiconductor device nor a wiring layer secondly provided in the semiconductor device. In wiring layers laminated adjacent to an interlayer insulating film in the vertical direction, the lower wiring layer is referred to as the first wiring layer, and the wiring layer provided above the first wiring layer is referred to as the second wiring layer. For example, in the configuration of FIG. 6, in the case where a wiring layer firstly provided in the semiconductor device is used, the first wiring layer is a wiring layer secondly provided in the semiconductor device, and the second wiring layer is a wiring layer thirdly provided in the semiconductor device. In order to electrically couple the wirings laminated adjacent to the interlayer insulating film in the vertical direction to each other, a via electrode VE1 can be formed by embedding a metal material into a hole part obtained by partially removing the interlayer insulating film by an etching method or the like.

With reference to FIG. 7, the first wiring layer has a plurality of wirings represented by solid lines and extending substantially in the lateral direction in planar view. The wirings of the first wiring layer include the first power supply wiring VDD, the second power supply wiring VSS, the bit lines BL0A, /BL01A, BL0B, and/BL0B, the search lines SL0 and/SL0, the word lines WL0 and WL1, and the match lines ML0 and ML1. Each of the wirings of the first wiring layer is coupled to the transistors shown in FIG. 6 through the contacts CT shown in FIG. 6.

The second wiring layer has a plurality of wirings represented by dotted lines and extending in the vertical direction in planar view. The wirings of the second wiring layer include the two second power supply wirings (first wirings) VSS and the word lines (the first word line and the second word line) WL0 and WL1 arranged between the two second power supply wirings (first wirings) VSS. Further, the two second power supply wirings VSS and the two word lines WL0 and WL1 configured using the second wiring layer are arranged while extending substantially parallel to each other in the vertical direction in planar view. Further, the two second power supply wirings VSS are arranged above the left and right boundaries between the memory cells MC0#0 and MC0#1.

The wirings (VSS, WL0, WL1, ML0, and ML1) of the first wiring layer are coupled to the wirings (VSS, WL0, WL1, ML0, and ML1) of the second wiring layer through the via electrode VE1, respectively. It should be noted that the wirings (ML0 and ML1) of the second wiring layer can be regarded as pedestal electrodes.

FIG. 8 is a diagram for showing a coupling relation between the wirings (VSS, ML0, and ML1) of the second wiring layer shown in FIG. 7 and the wirings (VSS, ML0, and ML1) of a third wiring layer. The wirings (VSS, ML0, and ML1) of the second wiring layer are represented by dotted lines, and the wirings (VSS, ML0, and ML1) of the third wiring layer are represented by solid lines. It should be noted that the second wiring layer and the third wiring layer neither mean a wiring layer secondly provided in the semiconductor device nor a wiring layer thirdly provided in the semiconductor device. In wiring layers laminated adjacent to an interlayer insulating film in the vertical direction, the lower wiring layer is referred to as the second wiring layer, and the wiring layer provided above the second wiring layer is referred to as the third wiring layer. In order to electrically couple the wirings laminated adjacent to the interlayer insulating film in the vertical direction to each other, a via electrode VE2 can be formed by embedding a metal material into a hole part obtained by partially removing the interlayer insulating film by an etching method or the like. Further, VSS, ML0, and ML1 described in the lower part of FIG. 8 are reference symbols related to the wirings of the third wiring layer.

Two second wirings (VSS) configured using the third wiring layer are arranged above the two first wirings (VSS) configured using the second wiring layer. The two second power supply wirings (first wirings) VSS configured using the second wiring layer and the two second power supply wirings (second wirings) VSS configured using the third wiring layer are electrically coupled to each other through the via electrodes VE2 with low resistance.

The wirings (match lines ML0 and ML1) of the third wiring layer are arranged above the two wirings (word lines WL0 and WL1) configured using the second wiring layer. However, in order to electrically couple the pedestal electrodes of the wirings (ML0 and ML1) of the second wiring layer and the wirings (match lines ML0 and ML1) of the third wiring layer to each other through the via electrode VE2, a part of each of the wirings (match lines ML0 and ML1) of the third wiring layer has an inversed-C shape so as to be arranged above the pedestal electrodes of the wirings (ML0 and ML1) of the second wiring layer. The wirings (match lines ML0 and ML1) of the third wiring layer are arranged between the two second wirings (VSS) configured using the third wiring layer. Further, the two second power supply wirings (second wirings) VSS configured using the third wiring layer and the two match lines ML0 and ML1 are arranged while extending substantially parallel to each other in the vertical direction in planar view.

FIG. 9 is a diagram for showing a coupling relation between the wirings (VSS, ML0, and ML1) of the third wiring layer shown in FIG. 8 and the wirings (VSS) of a fourth wiring layer. The wirings of the third wiring layer are represented by thin solid lines, and the wirings of the fourth wiring layer are represented by thick solid lines. It should be noted that the third wiring layer and the fourth wiring layer neither mean a wiring layer thirdly provided in the semiconductor device and a wiring layer fourthly provided in the semiconductor device. In wiring layers laminated adjacent to an interlayer insulating film in the vertical direction, the lower wiring layer is referred to as the third wiring layer, and the wiring layer provided above the second wiring layer is referred to as the fourth wiring layer. In order to electrically couple the wirings laminated adjacent to the interlayer insulating film in the vertical direction to each other, a via electrode VE3 can be formed by embedding a metal material into a hole part obtained by partially removing the interlayer insulating film by an etching method or the like. Further, VSS described in the lower part of FIG. 9 is a reference symbol related to the wirings of the fourth wiring layer.

The two wirings (VSS) configured using the fourth wiring layer are arranged above the two wirings (VSS) configured using the third wiring layer. The two second power supply wirings (third wirings) configured using the fourth wiring layer are arranged while extending substantially parallel to each other in the vertical direction in planar view. The width of each of the two third wirings (VSS) configured using the fourth wiring layer is wider than that of each of the two second wirings (VSS) configured using the third wiring layer, and is configured to cover the two second wirings (VSS) configured using the third wiring layer. In addition, the two second wirings (VSS) configured using the third wiring layer and the two third wirings (VSS) configured using the fourth wiring layer are electrically coupled to each other through the via electrodes VE3 with low resistance. The width of each of the two fourth wirings (VSS) configured using the fourth wiring layer is made wider than that of each of the two second wirings (VSS) configured using the third wiring layer, so that most upper parts of the wirings of the match lines ML0 and ML1 configured using the third wiring layer are covered. Accordingly, the two third wirings (VSS) of the fourth wiring layer can be provided with a function of shielding the match lines ML0 and ML1 configured using the third wiring layer from the upper direction. Thereby, the influence on the match lines ML0 and ML1 of the third wiring layer due to noise from the upper layer side of the fourth wiring layer can be reduced by the shield function of the two third wirings (VSS) of the fourth wiring layer.

As described above using FIG. 6 to FIG. 9, the two second power supply wirings VSS and the word lines WL0 and WL1 arranged between the two second power supply wirings VSS are arranged in the second wiring layer. In the third wiring layer, the two wirings (VSS) configured using the third wiring layer are coupled to the two wirings (VSS) configured using the second wiring layer with low resistance through the via electrodes VE2. Further, the match lines ML0 and ML1 configured using the third wiring layer are arranged between the two wirings (VSS) configured using the third wiring layer. In addition, the two wirings (VSS) configured using the fourth wiring layer are coupled to the two wirings (VSS) configured using the third wiring layer with low resistance through the via electrodes VE3.

The ground potential VSS of the memory cells MC0#0 and MC0#1 can be supplied with low resistance by the above-described configuration. Even in the case where a current largely flows at the time of the search operation, the potential fluctuation (IR drop) due to the parasitic resistance of the wirings supplying the ground potential VSS can be reduced. Further, the wirings supplying the ground potential VSS can improve the electromigration (EM) resistance.

[Modified Example of Match Lines ML0 and ML1]

FIG. 10 is a diagram for showing a modified example of the match lines ML0 and ML1 of FIG. 8. In FIG. 8, a part of each of the wirings of the match lines ML0 and ML1 configured using the third wiring layer has an inversed-C shape. However, as shown in FIG. 10, a part of each of the wirings of the match lines ML0 and ML1 configured using the third wiring layer can be configured so as to have a convex part. In this case, the shape of each of the pedestal electrodes of the match lines ML0 and ML1 configured using the second wiring layer also needs to be configured in accordance with the convex part.

[Modified Example of FIG. 7 and FIG. 8: Shield Wiring]

Figure 12:
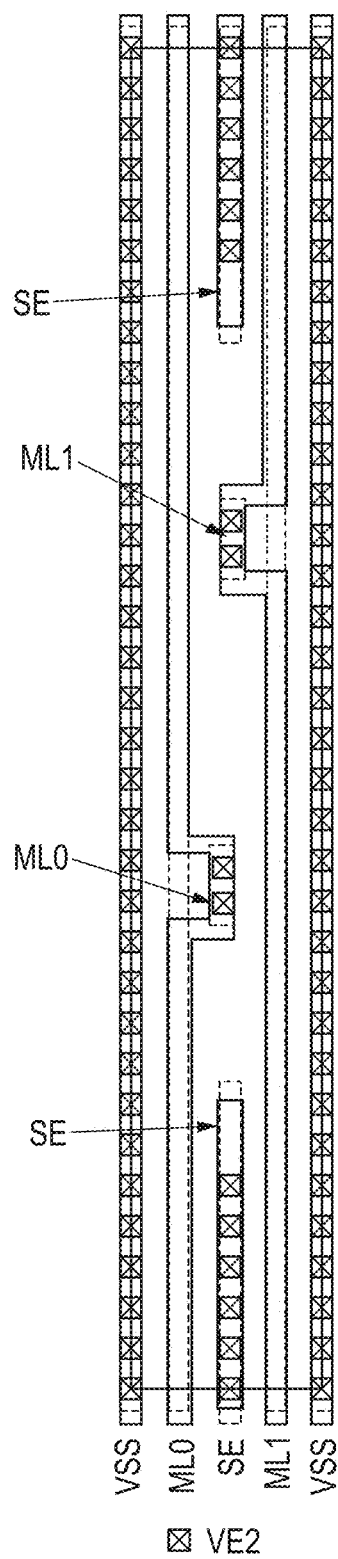
FIG. 12 shows a modified example of FIG. 8 and is diagram in which the shield wiring is provided.

FIG. 11 and FIG. 12 are diagrams for showing modified examples of FIG. 7 and FIG. 8. As shown in FIG. 11 and FIG. 12, shield wirings SE coupled to the ground potentials VSS are provided. The other configurations are the same as those of FIG. 7 and FIG. 8. The match lines ML0 and ML1 are provided in the third wiring layer. Since the match lines ML0 and ML1 of the third wiring layer are provided substantially in parallel with each other, there is a possibility of a malfunction due to signal interference between the match lines ML0 and ML1. In order to prevent the malfunction, the shield wirings SE coupled to the ground potentials VSS are provided in the second wiring layer (see FIG. 11) and the third wiring layer (see FIG. 12). The shield wirings SE of the second wiring layer are coupled to the VSS wirings of the first wiring layer through the via electrodes VE1. Further, the shield wirings SE of the second wiring layer are coupled to the shield wirings SE of the third wiring layer through the via electrodes VE2. The shielding between the match lines ML0 and ML1 is performed as much as possible in accordance with the shield function of the two wirings (VSS) of the fourth wiring layer described in FIG. 9. Accordingly, generation of the malfunction due to the signal interference between the match lines ML0 and ML1 can be reduced.

[Modified Example of FIG. 11, FIG. 12, and FIG. 9: Signal Wiring Area]

Figure 13:
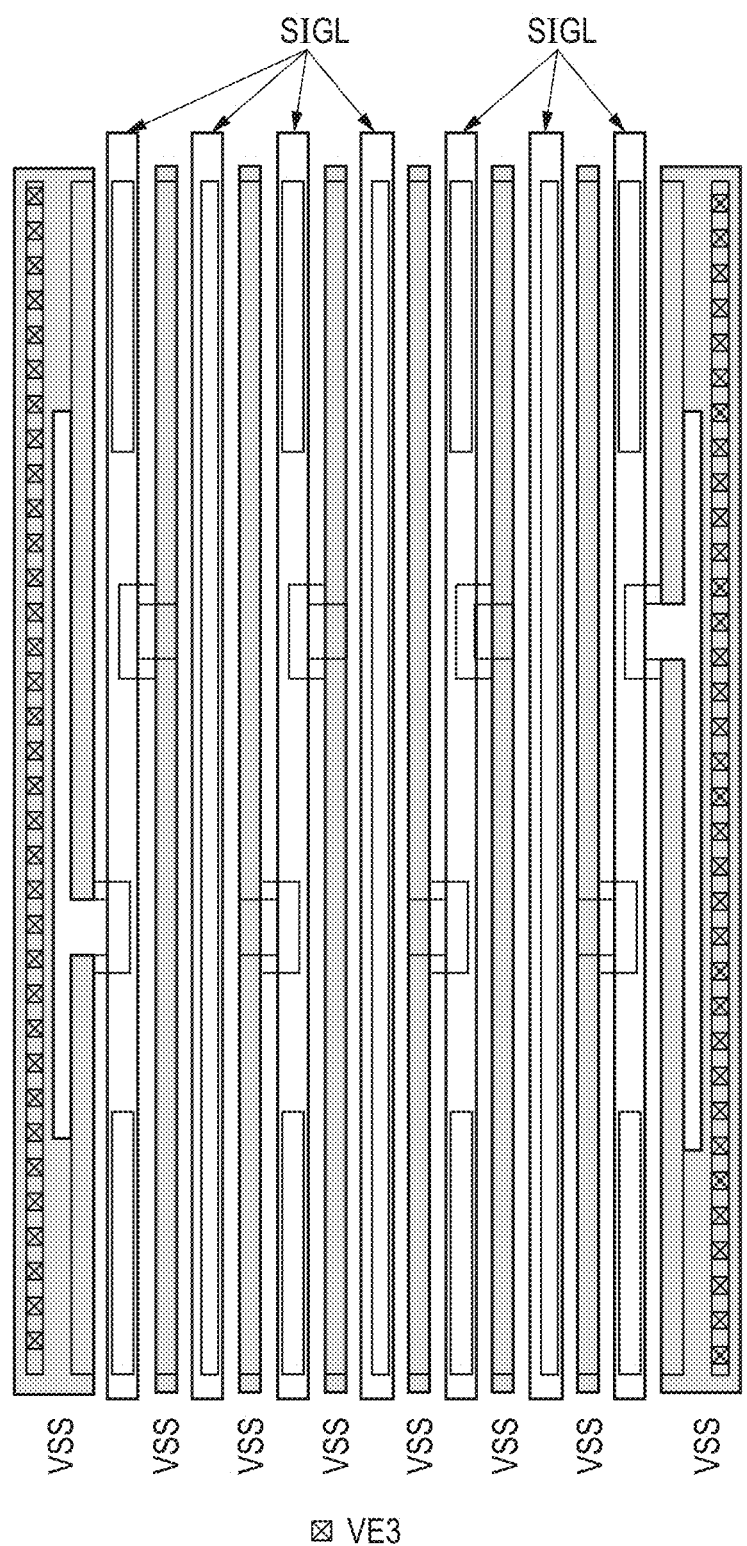
FIG. 13 is a diagram for showing a configuration in which a plurality of signal wirings is provided in the upper part of the memory array CRAY.

FIG. 13 is a diagram for showing a modified example of FIG. 11, FIG. 12, and FIG. 9. In FIG. 11, FIG. 12, and FIG. 9, the shield wirings SE of the second wiring layer and the shield wirings SE of the third wiring layer as the shield wirings and the two wirings (VSS) of the fourth wiring layer are used for the match lines ML0 and ML1. Therefore, in the configuration of FIG. 9, the VSS wirings each having a large width and configured using the fourth wiring layer are arranged in the entirety of the upper part of the memory array CARY. This configuration is effective as a function of shielding the match line ML. However, there is also a demand of arranging signal wirings in the upper part of the memory array CRAY.

FIG. 13 is a diagram for showing a configuration in which a plurality of signal wirings is provided in the upper part of the memory array CRAY. FIG. 13 shows the wirings (see FIG. 12) of the third wiring layer and the wirings (VSS and SGIL) of the fourth wiring layer in the layout arrangement of the memory cells of four rows. Eight VSS wirings of the fourth wiring layer are arranged, and seven signal wirings SIGL are provided between each pair of VSS wirings. The VSS wirings located at the both ends among the eight VSS wirings are coupled to the VSS wirings configured using the third wiring layer of the lower layer through the via electrodes VE3. On the other hand, six VSS wirings sandwiched between the VSS wirings located at the both ends are not coupled to the VSS wirings configured using the third wiring layer of the lower layer through the via electrodes VE3, but are coupled to wirings through which the ground potential VSS is supplied in other parts of the memory array CARY.

Although there is a possibility that the shield function is slightly deteriorated, an area where the signal wirings SIGL are provided can be secured on the memory array CRAY by the above-described configuration. Accordingly, it is possible to compensate lack of the signal wiring area on the memory array CRAY.

Configuration Example 2 of TCAM Cell

Figure 18:
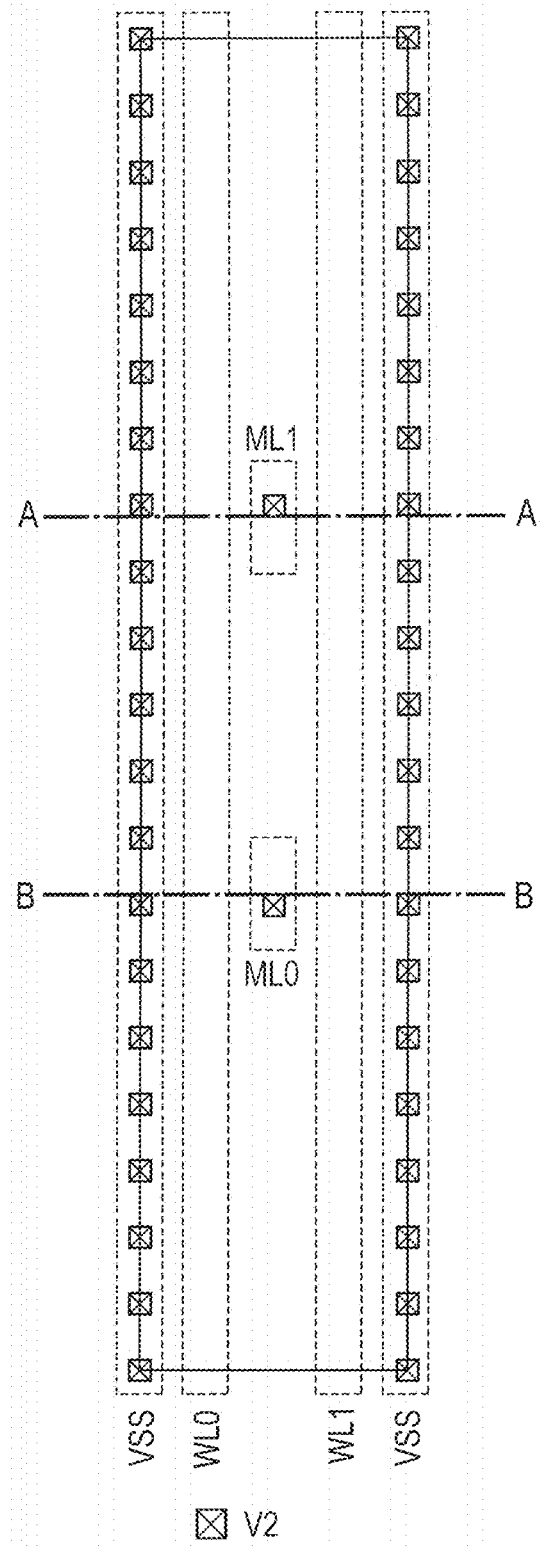
FIG. 18 is a diagram for showing a relation between the wirings (VSS, WL0, WL1, VSS, ML0, and ML1) of the second wiring layer and via electrodes V2.
Figure 19:
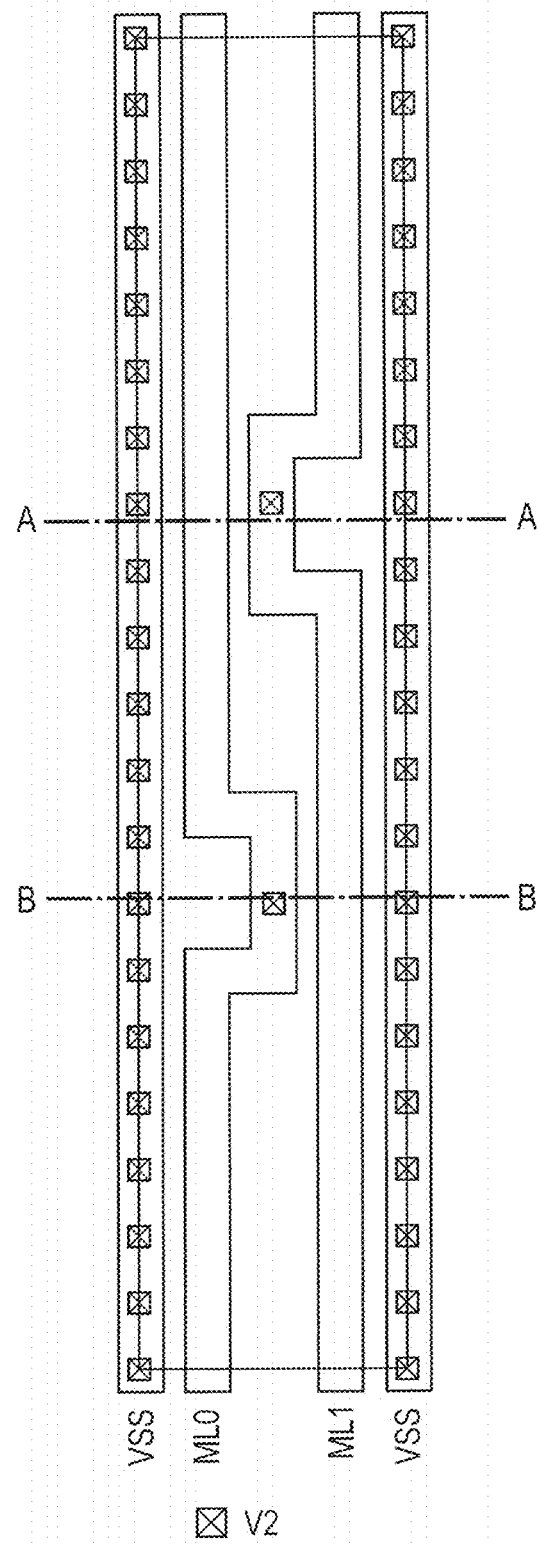
FIG. 19 is a diagram for showing a relation between the wirings of the third wiring layer and the via electrodes V2.
Figure 20:
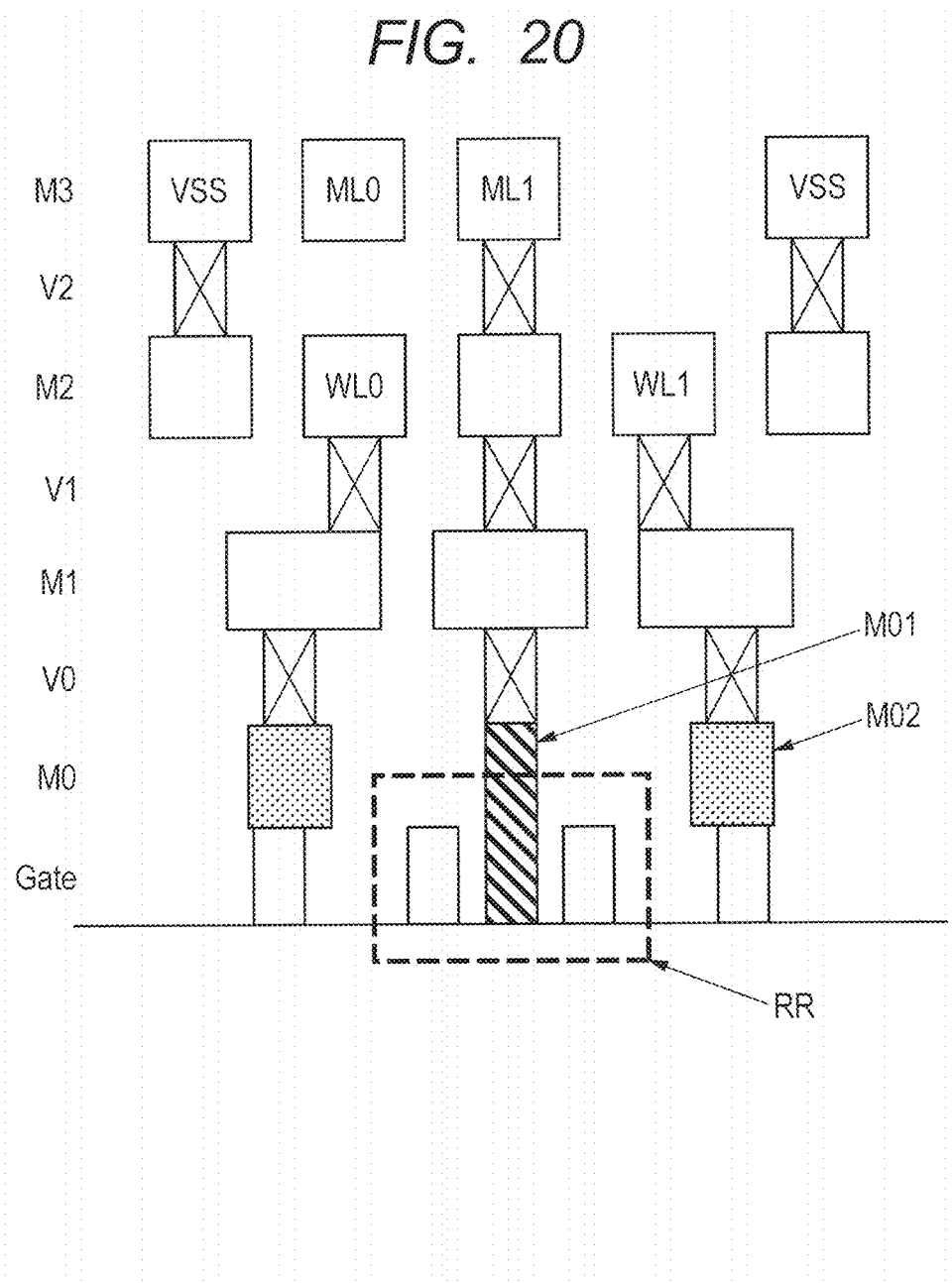
FIG. 20 is a first cross-sectional view of the memory cells taken along the line A-A in the case where
Figure 21:
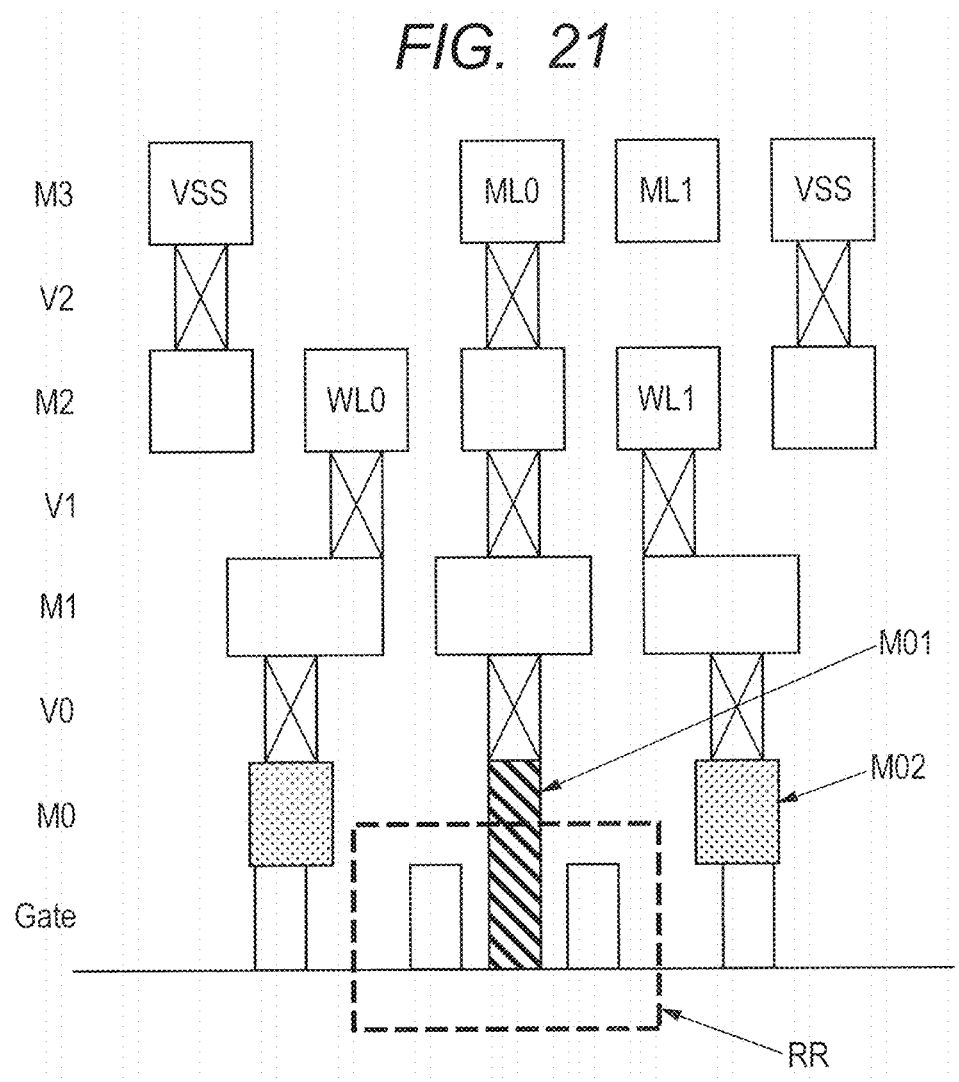
FIG. 21 is a second cross-sectional view of the memory cells taken along the line B-B in the case where
Figure 22:
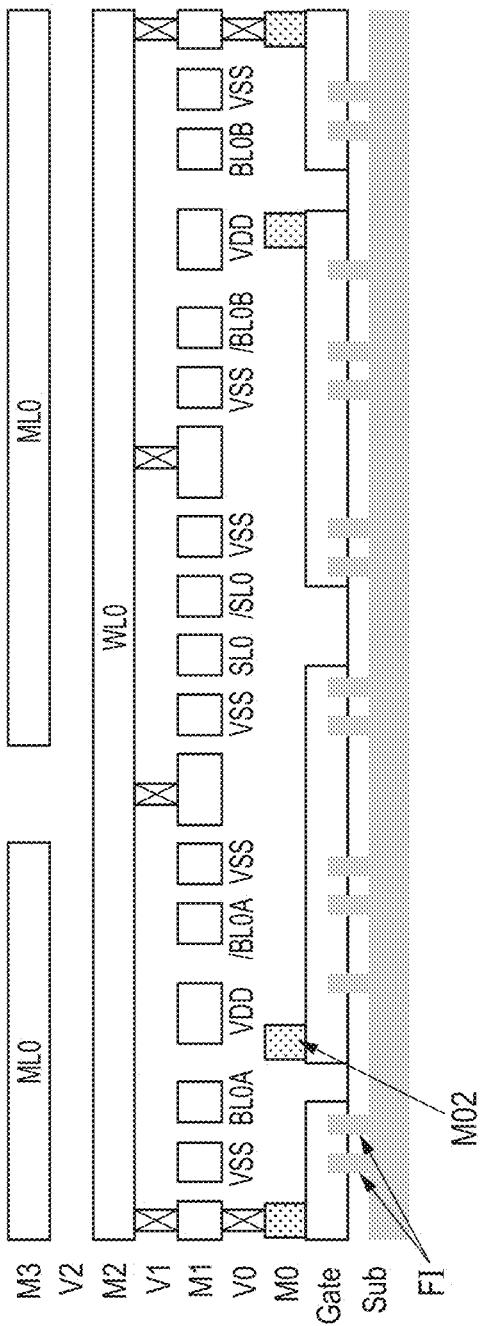
FIG. 22 is a third cross-sectional view taken along the line C-C of FIG. 14 in the case where
Figure 23:
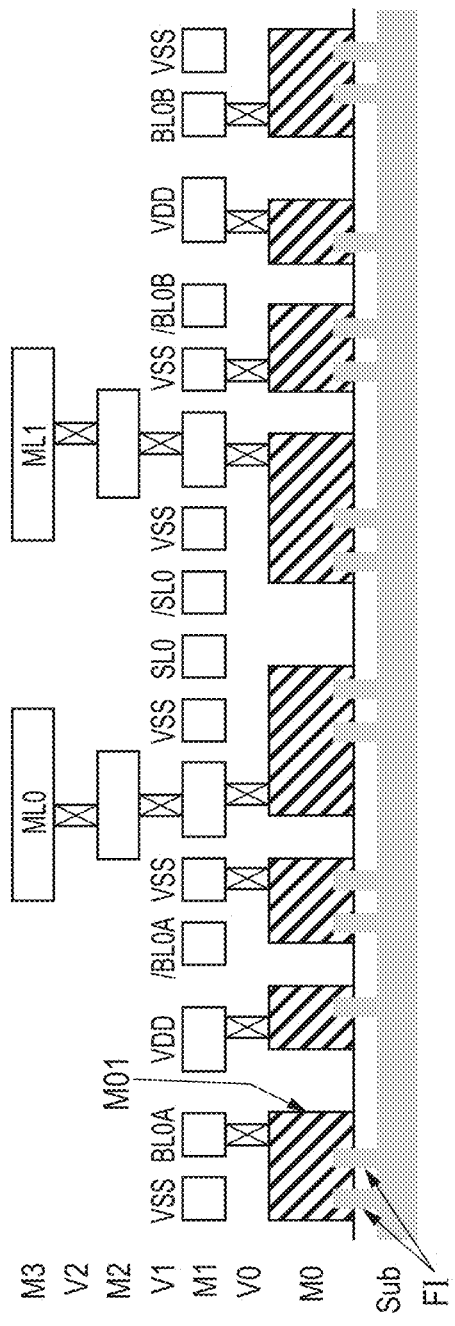
FIG. 23 is a fourth cross-sectional view taken along the line D-D of FIG. 14 in the case where

FIG. 14 to FIG. 23 are diagrams each showing a configuration of the TCAM cell according to the example. FIG. 14 to FIG. 23 show a configuration example in the case where the memory cells MC0#0 and MC0#1 shown in FIG. 4 are formed using fin-type transistors (FinFET). FIG. 14 and FIG. 16 to FIG. 19 are outline plan views each showing a planar layout configuration of the TCAM cell while being divided in the laminating direction. FIG. 20 is a first cross-sectional view of the memory cells taken along the line A-A in the case where FIG. 14 and FIGS. 16 to 19 are overlapped with each other. FIG. 21 is a second cross-sectional view of the memory cells taken along the line B-B in the case where FIG. 14 and FIGS. 16 to 19 are overlapped with each other. FIG. 22 is a third cross-sectional view taken along the line C-C of FIG. 14 in the case where FIG. 14 and FIGS. 16 to 19 are overlapped with each other. FIG. 23 is a fourth cross-sectional view taken along the line D-D of FIG. 14 in the case where FIG. 14 and FIGS. 16 to 19 are overlapped with each other. In FIG. 20 and FIG. 21, as an explanation of each wiring layer, the gate (gate), the coupling wiring (M0), the via electrode (V0), the first wiring layer (M1), the via electrode (V1), the second wiring layer (M2), the via electrode (V2), and the third wiring layer (M3) are described in order from the bottom on the left side of each drawing. It should be noted that an area RR represented by a dotted line in each of FIG. 20 and FIG. 21 corresponds to a part where a first coupling electrode M01 is provided between the two gates, and this configuration causes an increase in parasitic capacitance in the memory cells using the FinFET transistors. In FIG. 22 and FIG. 23, as an explanation of each wiring layer, the semiconductor substrate (sub), the gate (gate), the coupling wiring (M0), the via electrode (V0), the first wiring layer (M1), the via electrode (V1), the second wiring layer (M2), the via electrode (V2), and the third wiring layer (M3) are described in order from the bottom on the left side of each drawing. FIG. 20 to FIG. 23 can be appropriately referred to in the following explanation.

Figure 14:
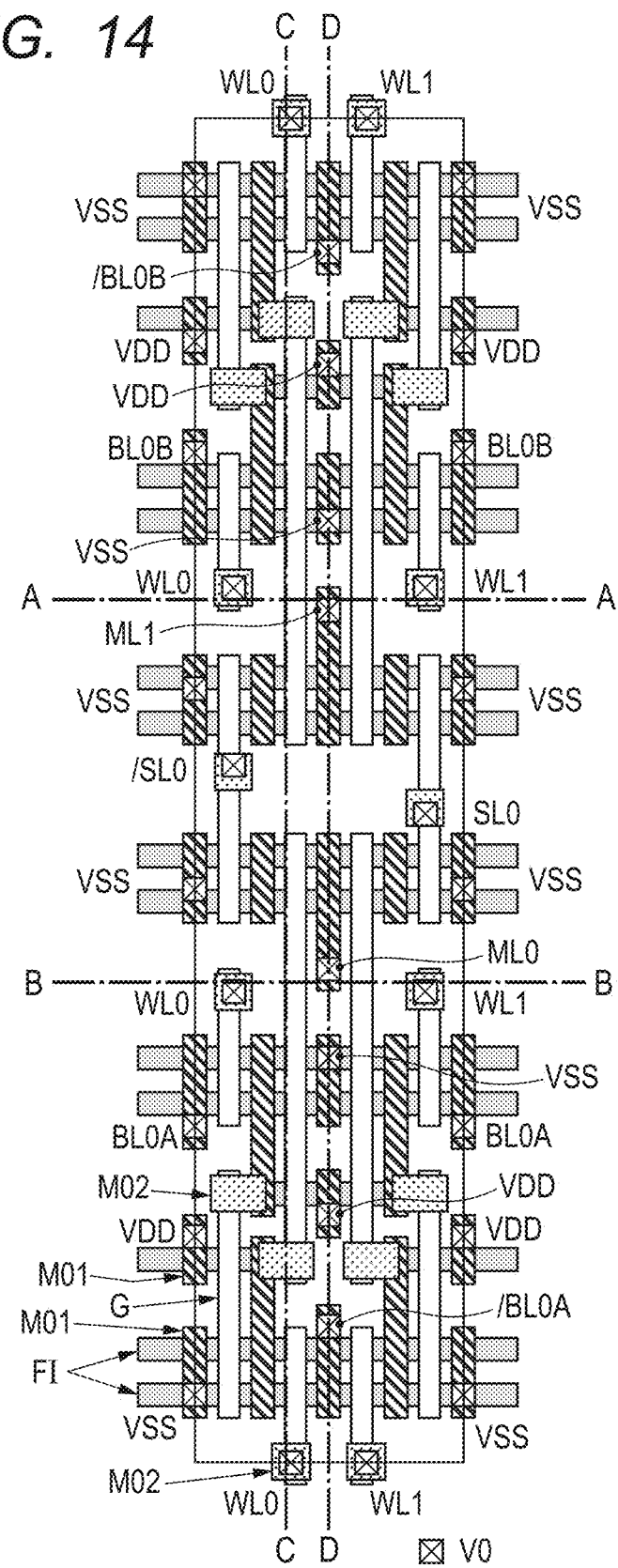
FIG. 14 shows a layout of the TCAM cell according to the example, and is a diagram for showing arrangements of FinFETs, a coupling wiring, and a via electrode.
Figure 15:
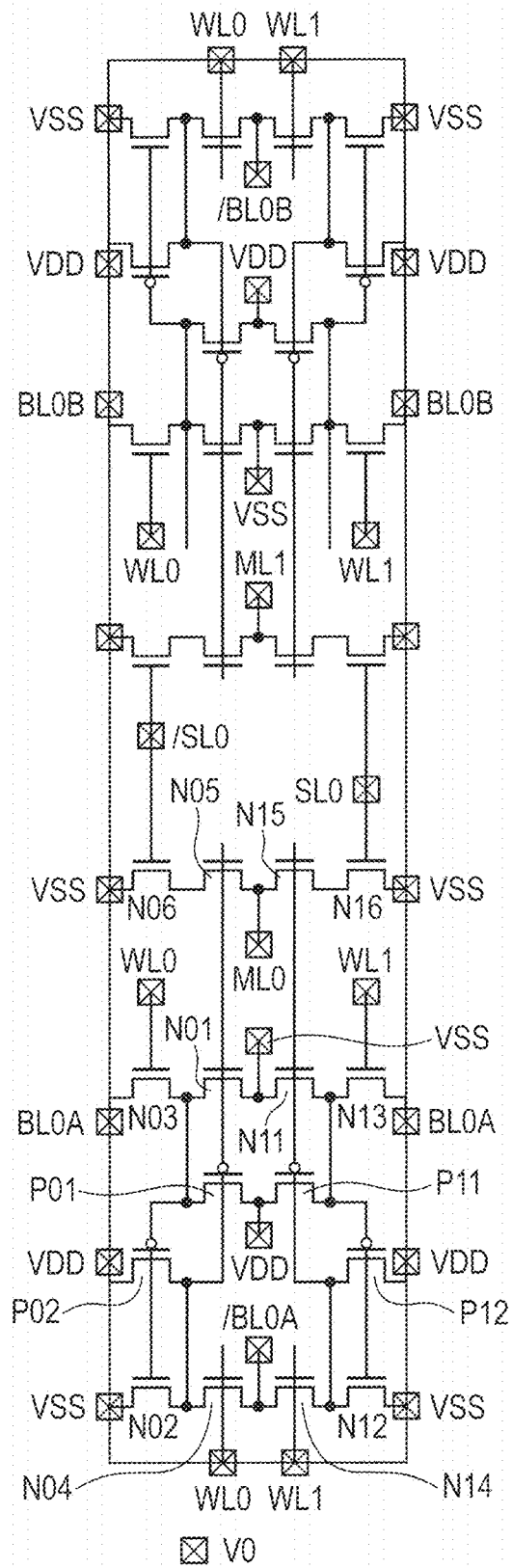
FIG. 15 shows arrangements of the transistors (see FIG. 1 and FIG. 4) configuring the memory cells MC0#0 and MC0#1 of FIG. 14, the wirings coupled to the memory cells, and the via electrodes serving as coupling parts.

FIG. 14 is a diagram for showing arrangements of the FinFETs, the coupling wiring, and the via electrode in the planar layout of the TCAM cell. FIG. 15 shows arrangements of the transistors (see FIG. 1 and FIG. 4) configuring the memory cells MC0#0 and MC0#1 of FIG. 14, the wirings coupled to the memory cells, and the via electrodes serving as coupling parts.

With reference to FIG. 14, fin parts FI of each FinFET are arranged substantially in parallel with each other in the lateral direction in planar view. The gates G of the FinFETs are arranged in the vertical direction in planar view. In a part where the gate G intersects with the fin part FI, a gate oxide film is formed between the gate G and the fin part FI, and a channel area of the FinFET is configured in the fin part FI. Further, a source area and a drain area of the FinFET are configured on the both sides of the channel area of the fin part FI. A first coupling wiring M01 is a wiring mainly coupling the fins FI to each other, and is arranged while extending in the vertical direction in planar view. A second coupling wiring M02 is mainly used to couple the gates G to via electrodes VE0 and to couple the gates G to the first coupling wiring M01.

In FIG. 14, signals of the wirings coupled to the via electrodes VE0 are described. The wirings are the first power supply wiring VDD, the second power supply wiring VSS, the word lines WL0 and WL1, the bit lines BL0A, /BL01A, BL0B, and/BL0B, the search lines SL0 and/SL0, and the match lines ML0 and ML1.

FIG. 15 shows arrangements of the transistors (see FIG. 1 and FIG. 4) configuring the memory cells MC0#0 and MC0#1 of FIG. 14, the wirings coupled to the memory cells, and the via electrodes serving as coupling parts. In FIG. 15, the coupling and arrangements of the transistors (N01-N06, P01, P02, N11-N06, P11, and P12) configuring the memory cell MC0#0 and the via electrodes VE0 are described. It should be noted that although not illustrated in FIG. 15, the memory cell MC0#1 also has transistors similar to those configuring the memory cell MC0#0.

In FIG. 15, the transistors (N02, N04, N14, N12, N03, N01, N11, N13, N06, N05, N15, and N16) a part of the symbols of which is thick are configured in such a manner that two MOS transistors are coupled in parallel with each other as being apparent from FIG. 14. Accordingly, the driving capability is made appropriate.

Figure 16:
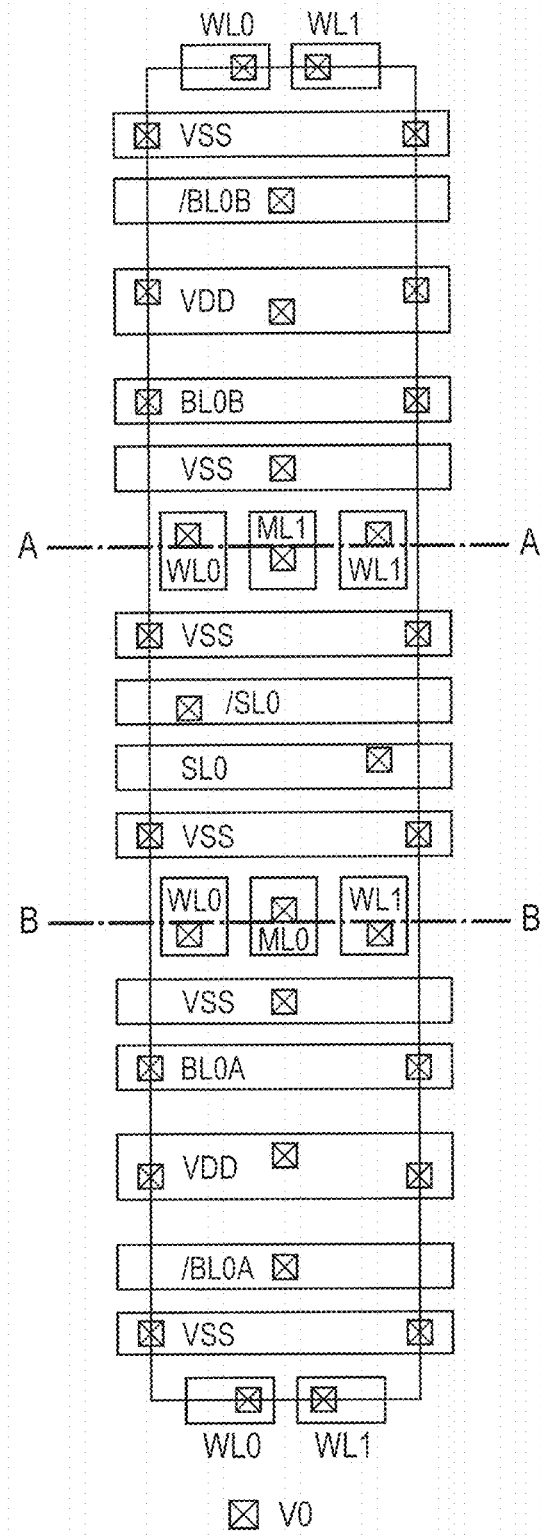
FIG. 16 is a diagram for showing a relation between the wirings of the first wiring layer and via electrodes V0.

FIG. 16 is a diagram for showing a relation between the wirings of the first wiring layer and the via electrodes V0. The wirings (VDD, VSS, BL0A, /BL01A, BL0B, /BL0B, SL0, and/SL0) of the first wiring layer are provided in parallel with each other in the lateral direction in planar view. Further, the wirings of the word lines WL0 and WL1 and the match lines ML0 and ML1 configured using the first wiring layer are provided as pedestal electrodes.

Figure 17:
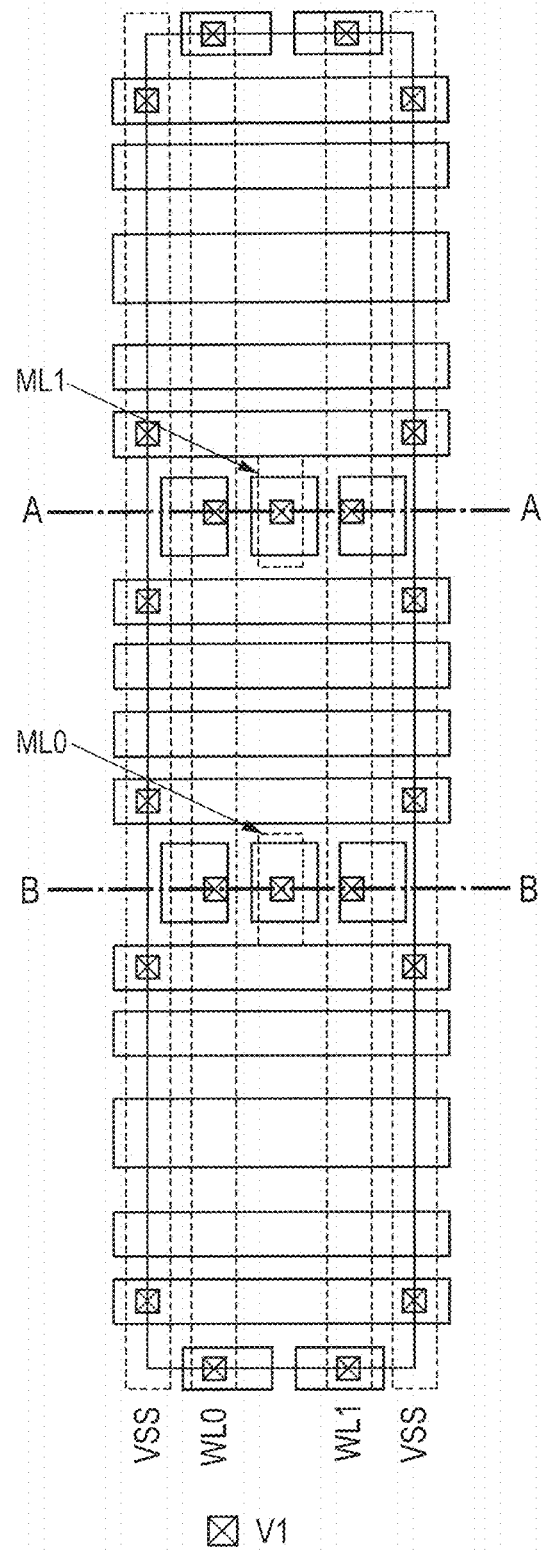
FIG. 17 is a diagram for showing a relation among the wirings of the first wiring layer, the wirings of the second wiring layer, and via electrodes V1.

FIG. 17 is a diagram for showing a relation among the wirings of the first wiring layer, the wirings of the second wiring layer, and the via electrodes V1. The wirings (VSS, WL0, WL1, VSS, ML0, and ML1) of the second wiring layer are illustrated by doted lines. The wirings (VSS, WL0, WL1, and VSS) of the second wiring layer are provided in parallel with each other in the vertical direction in planar view. The two word lines WL0 and WL1 are provided between the two VSS wirings. The wirings (ML0 and ML1) of the second wiring layer are pedestal electrodes. The via electrodes V1 are used to couple the wirings (VSS, WL1, WL1, ML0, and ML1) of the first wiring layer to the wirings (VSS, WL0, WL1, VSS, ML0, and ML1) of the second wiring layer.

FIG. 18 is a diagram for showing a relation between the wirings (VSS, WL0, WL1, VSS, ML0, and ML1) of the second wiring layer illustrated by dotted lines and the via electrodes V2. FIG. 19 is a diagram for showing a relation between the wirings of the third wiring layer illustrated by solid lines and the via electrodes V2. The via electrodes V2 are used to couple the wirings (VSS, ML0, ML1, and VSS) of the second wiring layer to the wirings (VSS, ML0, ML1, and VSS) of the third wiring layer. In FIG. 19, the wirings (VSS, ML0, ML1, and VSS) of the third wiring layer are provided in parallel with each other in the vertical direction in planar view. The two match lines ML0 and ML1 configured using the third wiring layer are provided between the two VSS wirings.

It should be noted that the configurations of FIG. 10 to FIG. 13 can be applied to FIG. 17 to FIG. 19.

[Modified Example of Block Configuration of Content Addressable Memory (TCAM Device)]

Figure 24:
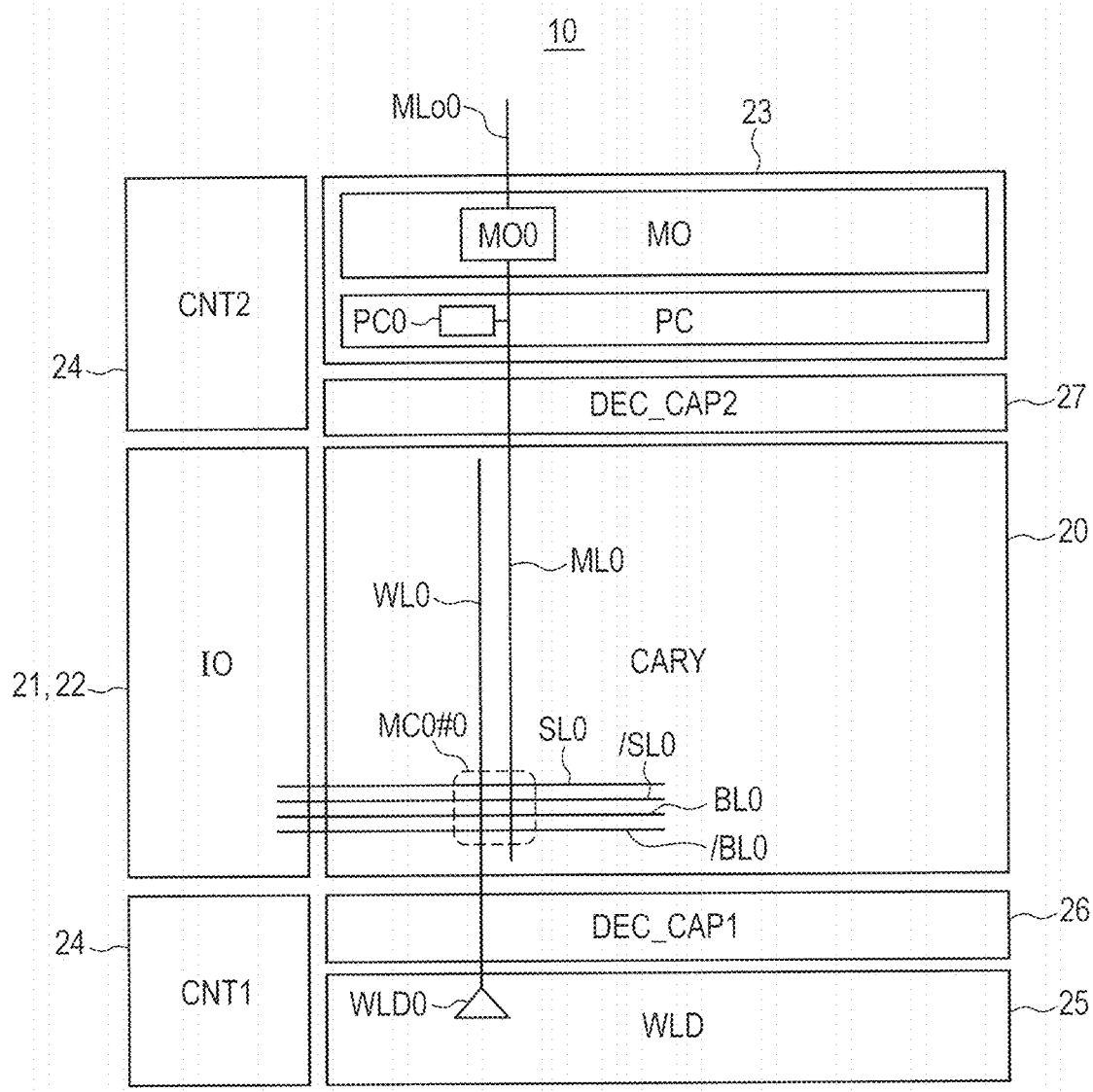
FIG. 24 shows a conceptual block diagram of a content addressable memory (TCAM device) according to a modified example.

FIG. 24 shows a conceptual block diagram of the content addressable memory (TCAM device) according to a modified example. In FIG. 5, a decoupling capacitance is not provided between the memory array (CRAY) 20 and the word line driver (WLD) 25 and between the memory array (CRAY) 20 and the match line output circuit unit (MO) 23. FIG. 24 shows a modified example of the TCAM macro cell 10 of the TCAM device 1. In FIG. 24, a formation area 26 for a decoupling capacitance (DEC_CAP1) is provided between the memory array (CRAY) 20 and the word line driver (WLD) 25, and a formation area 27 for a decoupling capacitance (DEC_CAP2) as a functional block is provided between the memory array (CRAY) 20 and the match line output circuit unit (MO) 23. The other configurations are the same as those of FIG. 5. It should be noted that the functional block may be a function other than the decoupling capacitance. For example, a circuit for increasing the speed of the potential of the match line may be provided.

FIG. 24 exemplifies the TCAM memory cell MC0#0, and the word line WL0, the match line ML0, the pair of bit lines BL0 and /BL0, and the pair of search lines SL0 and/SL0 coupled to the TCAM memory cell MC0#0. In order to simplify the drawing, the word line WL1 coupled to the TCAM memory cell MC0#1 is not illustrated. The word line driver (WLD) 25 has a word line driver WLD0 coupled to the word line WL0 to drive the same. The match line output circuit unit (MO) 23 includes a match line output circuit MO and a precharge circuit PC. The match line output circuit MO includes a match line output circuit MO0 coupled to the match line ML0, and the output of the match line output circuit MO0 is joined to a match signal output line MLo0. The precharge circuit PC includes a precharge circuit PC0 coupled to the match line ML0.

It should be noted that the control logic circuit 24 is divided into a first control circuit CNT1 and a second control circuit CNT2 in this example, and the second control circuit CNT2 has a function of generating control signals MEN and PCE for the match line output circuit MO0 and the precharge circuit PC0. The control signal MEN instructs the operation timing of the match line output circuit MO0. Further, the control signal PCE instructs the operation timing of the precharge circuit PC0.

Figure 25:
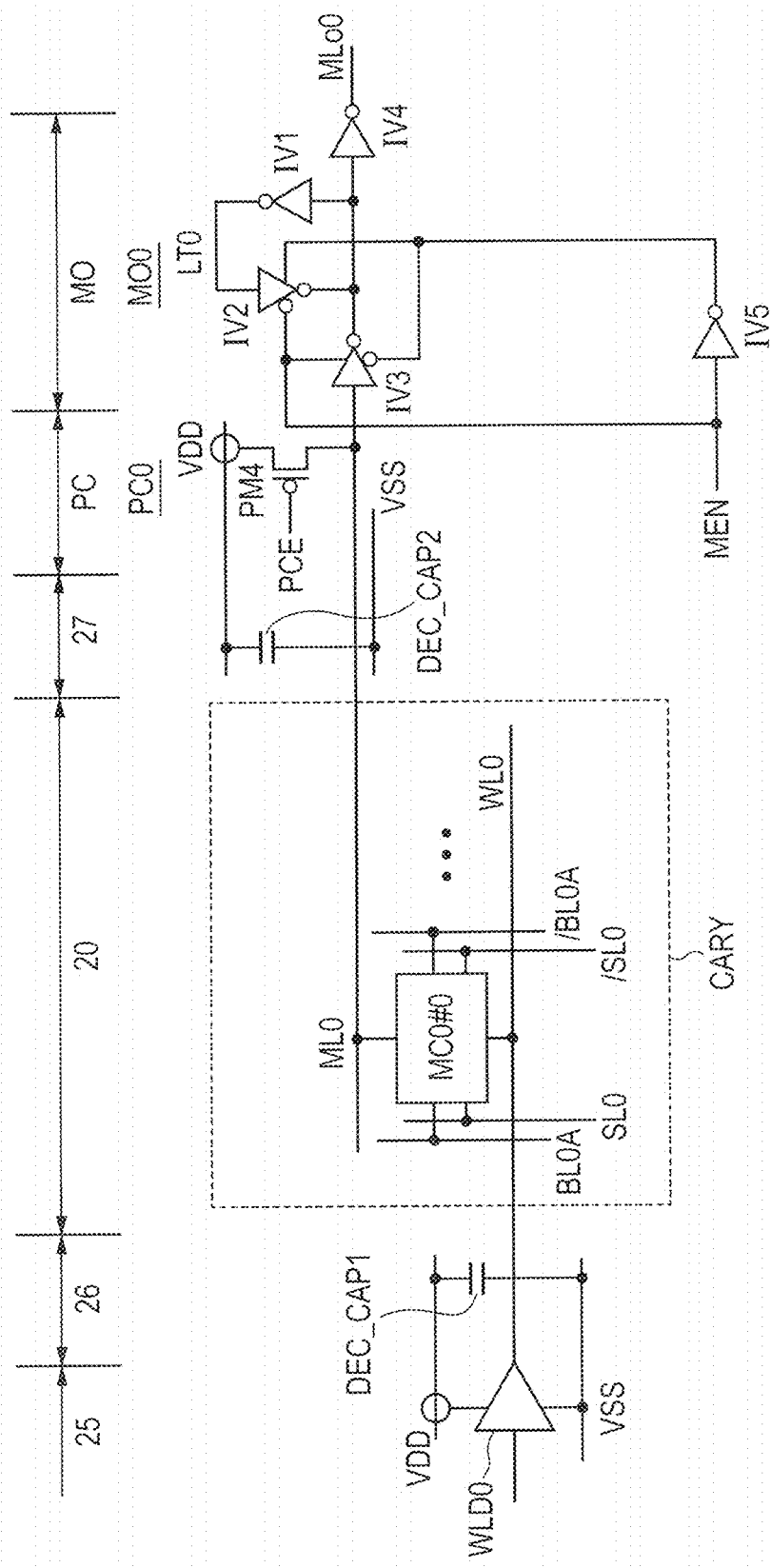
FIG. 25 is a schematic circuit diagram according to the modified example of FIG. 24.

FIG. 25 is a schematic circuit diagram according to the modified example of FIG. 24. The word line driver (WLD) 25 has the word line driver WLD0 coupled to the word line WL0 to drive the same. The word line driver WLD0 is joined to a supply wiring of a first power supply potential VDD and a supply wiring of a second power supply potential VSS. The formation area 26 for the decoupling capacitance (DEC_CAP1) has the decoupling capacitance DEC_CAP1 joined between the supply wiring of the first power supply potential VDD and the supply wiring of the second power supply potential VSS. The decoupling capacitance DEC_CAP1 is a decoupling capacitor, functions as a part temporarily holding electricity, absorbs current changes of power supply voltages (VDD and VSS) by the word line driver WLD0, and functions to prevent the fluctuation of the power supply voltages (VDD and VSS) and generation of noise.

The precharge circuit PC0 in the precharge circuit PC and the match line output circuit MO0 in the match line output circuit MO are joined to the match line ML0 formed in the memory array (CARY) 20. The formation area 27 for the decoupling capacitance (DEC_CAP2) is provided between the memory array (CARY) 20 and the precharge circuit PC. As similar to the decoupling capacitance DEC_CAP1, the decoupling capacitance (DEC_CAP2) is a decoupling capacitor, functions as a part temporarily holding electricity, absorbs current changes of the power supply voltages (VDD and VSS) by the precharge circuit PC0, and functions to prevent the fluctuation of the power supply voltages (VDD and VSS) and generation of noise.

The precharge circuit PC0 is configured using a P-channel MOS transistor PM4. The P-channel MOS transistor PM4 is provided to charge the match line ML0 to a precharge potential such as the high level. The gate of the P-channel MOS transistor PM4 receives, for example, a precharge enable signal PCE. The precharge enable signal PCE is a signal such as an inverted signal of the search line enable signal SLE for instructing the search operation or the search access operation. Namely, in the case where the operation is not the search operation or the search access operation, the precharge enable signal PCE is set to the selection level such as the low level, and the precharge circuit PC0 precharges the match line ML0. On the other hand, in the case where the operation is the search operation or the search access operation, the precharge enable signal PCE is set to the non-selection level such as the high level, and the precharge circuit PC0 stops precharging the match line ML0.

The match line output circuit MO0 includes inverter circuits IV1 to IV4, and a latch circuit LT0 is configured using the inverter circuits IV1 and IV2. The input of the latch circuit LT0 is coupled to the match line ML0 through the inverter circuit IV3. The output of the latch circuit LT0 is coupled to the match signal output line MLo0 through the inverter circuit IV4. The operations of the inverter circuits IV2 and IV3 are controlled by a match output enable signal MEN and the inverted signal of the match output enable signal MEN generated by an inverter circuit IV5. When the match output enable signal MEN is set to the selection level such as the high level, the inverter circuit IV3 is turned on, the inverter circuit IV2 is turned off, and the level of the match line ML0 is taken in to the latch circuit LT0. When the match output enable signal MEN is set to the non-selection level such as the low level, the inverter circuit IV3 is turned off, the inverter circuit IV2 is turned on, and the level of the match line ML0 is held by the latch circuit LT0.

As described above, the formation area 26 for the decoupling capacitance (DEC_CAP1) is provided between the memory array (CRAY) 20 and the word line driver (WLD) 25, and the formation area 27 for the decoupling capacitance (DEC_CAP2) is provided between the memory array (CRAY) 20 and the match line output circuit unit (MO) 23. Current changes of the power supply voltages (VDD and VSS) are absorbed by the configuration, and it is possible to prevent the fluctuation of the power supply voltages (VDD and VSS) and generation of noise.

The TCAM device 1 consumes a large amount of electric power when the match line ML (ML0) is precharged. The electric power consumption causes a voltage drop (IR drop) in the power supply wiring supplying the power supply potentials VDD and VSS due to the parasitic resistance. Although the decoupling capacitance (DEC_CAP2) is arranged in order to suppress this, efficient decoupling can be realized, and the IR drop can be effectively suppressed by arranging the capacitance (DEC_CAP2) between the match line precharge unit (PC) and the cell array unit (CRAY:20).

FIG. 26 shows a layout configuration of the word lines according to FIG. 24. FIG. 27 is a cross-sectional view taken along the line F-F of FIG. 26.

With reference to FIG. 26 and FIG. 27, the word lines WL0 to WL3 are provided in parallel with each other in the vertical direction in planar view. The word lines WL0 to WL3 are configured using wiring layers Mx in the formation area for the word line driver (WLD) 25 and the formation area for the memory array (CARY) 20. On the other hand, the word lines WL0 to WL3 provided above the formation area 26 for the decoupling capacitance (DEC_CAP1) are configured using wiring layers Mx+1 provided above the wiring layers Mx. The word lines WL0 to WL3 configured using the wiring layers Mx and the word lines WL0 to WL3 configured using the wiring layers Mx+1 are electrically coupled to each other through via electrodes VEx. Although not particularly limited, the wiring layers Mx are, for example, the wirings of the first wiring layer in FIG. 7, and the wiring layers Mx+1 are the wirings of the second wiring layer. It should be noted that the VSS wirings of FIG. 7 are not illustrated in FIG. 26. The VSS wirings configured using the wiring layers Mx are arranged on the left side of the word line WL0, between the word lines WL1 and WL2, and on the right side of the word line WL3 in the formation area for the memory array (CARY) 20 in FIG. 7 in planar view.

With the above-described configuration, it is possible to arrange the formation area 26 for the decoupling capacitance (DEC_CAP1) in an area between the formation area for the word line driver (WLD) 25 and the formation area for the memory array (CARY) 20 without being influenced by the wiring layers of the word lines (WL0 to WL3).

Figure 28:
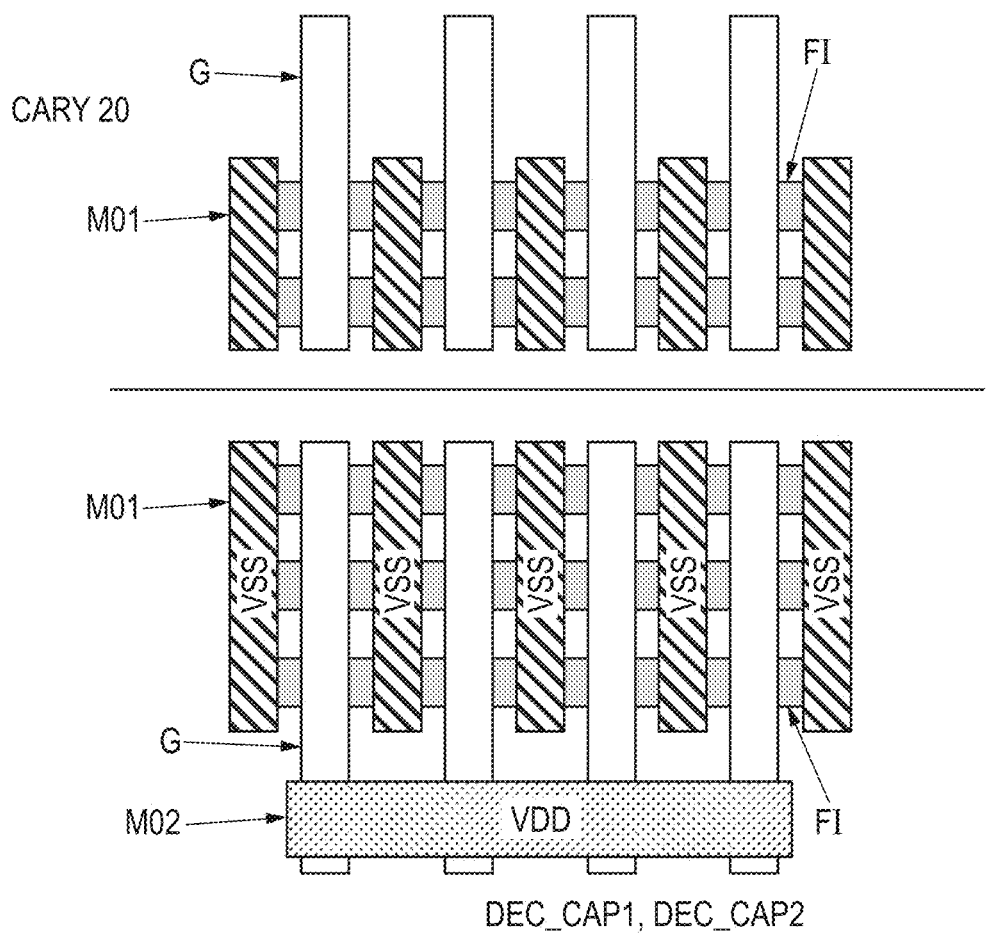
FIG. 28 is a diagram of a configuration example of a capacitance element using a gate capacitance.

FIG. 28 and FIG. 29 show configuration examples of a capacitance element according to a decoupling capacitance. FIG. 28 is a diagram of a configuration example of a capacitance element using a gate capacitance according to the FinFET technique, and FIG. 29 is a diagram of a configuration example of a capacitance element using an MIM capacitance.

In FIG. 28, the upper side shows a part of the memory cell MC0#0 in the memory array (CRAY) 20, and the lower side shows the decoupling capacitances (DEC_CAP1 and DEC_CAP2). The decoupling capacitances (DEC_CAP1 and DEC_CAP2) of this example are configured in such a manner that three fin parts FI arranged in the lateral direction are electrically joined to five coupling wirings M01 arranged in the vertical direction and coupled to the VSS potential, and four gates G provided in the vertical direction are provided between the five coupling wirings M01. The four gates G are coupled by a second coupling wiring M02 serving as the VDD potential on the lower side. Accordingly, the decoupling capacitances (DEC_CAP1 and DEC_CAP2) are configured using the fin parts FI, the gates G, and gate oxide films provided between intersection parts of the fin parts FI and the gates G.

Figure 30:
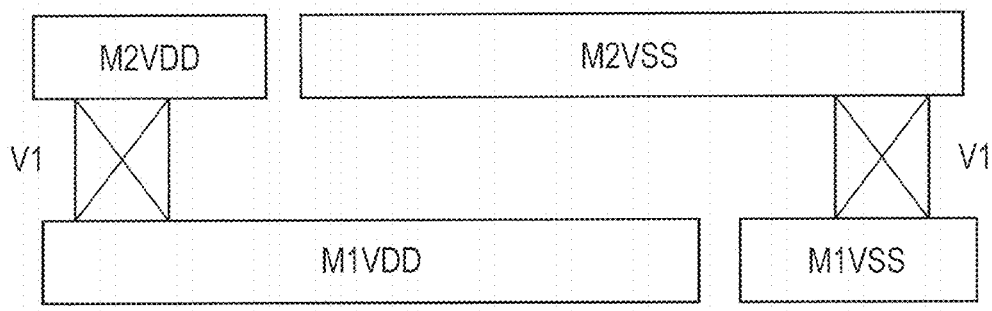
FIG. 30 is a cross-sectional view taken along the line G-G of FIG. 29A.
Figure 31:
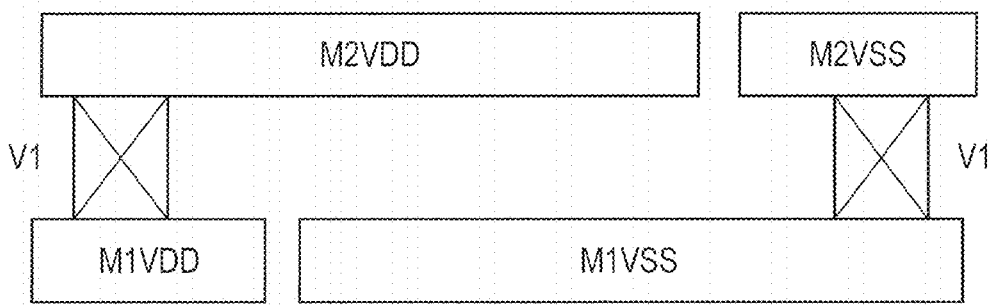
FIG. 31 is a cross-sectional view taken along the line F-F of FIG. 29A.

In FIG. 29, FIG. 29A shows a plan view of an MIM capacitance element configured by overlapping FIG. 29B and FIG. 29C with each other. FIG. 29B shows a layout arrangement of the first wiring layer. FIG. 29C shows a layout arrangement of the second wiring layer. FIG. 30 is a cross-sectional view taken along the line G-G of FIG. 29A. FIG. 31 is a cross-sectional view taken along the line F-F of FIG. 29A. It should be noted that the MIM capacitance is a technique of configuring a capacitance element using metal (M)/insulating film (I)/metal (M). It should be noted that the insulating film (I) means an interlayer insulating film.

FIG. 29B has two wirings M1VDD and M1VSS using the first wiring layer. The wiring M1VDD having a T-shape is coupled to the first power supply potential VDD, and includes a first wiring M110 provided in the vertical direction in planar view, and a second wiring M111 provided in the lateral direction and coupled to almost the middle of the first wiring M110. Further, the wiring M1VSS having a U-shape is formed so as to surround the three directions (upper, lower, and right directions) of the second wiring M111 in planar view. FIG. 29B shows first via electrodes V1. The first via electrodes V1 are provided in a first interlayer insulating film provided so as to cover the upper sides of the wirings M1VDD and M1VSS, and are used to be coupled to the second wiring layer.

FIG. 29C has two wirings M2VDD and M2VSS using the second wiring layer. The wiring M2VSS having a T-shape is coupled to the second power supply potential VSS, and includes a first wiring M210 provided in the vertical direction in planar view, and a second wiring M211 provided in the lateral direction and coupled to almost the middle of the first wiring M210. Further, the wiring M2VDD having a U-shape is formed so as to surround the three directions (upper, lower, and left directions) of the second wiring M211 in planar view. As shown in FIG. 30 and FIG. 31, the wiring M2VDD having a U-shape is coupled to the wiring M1VDD having a T-shape through the first via electrode V1. Further, as shown in FIG. 30 and FIG. 31, the wiring M2VSS having a T-shape is coupled to the wiring M1VSS having a U-shape through the first via electrode V1.

The invention achieved by the inventors has been concretely described above on the basis of the example. However, it is obvious that the invention is not limited to the above-described embodiment and example, and can be variously changed.

What is claimed is:

1. A semiconductor storage device comprising:
   a ternary content addressable memory (TCAM) cell array comprising a first TCAM cell and a second TCAM cell;
   a first word line;
   a second word line;
   a first match line;
   a second match line; and
   a pair of search lines,
   wherein the first TCAM cell is coupled to the first word line, the second word line, and the first match line,
   wherein the second TCAM cell is coupled to the first word line, the second word line, and the second match line,
   wherein the first TCAM cell and the second TCAM cell are arranged adjacent to each other in a first direction in a planar view,
   wherein the first TCAM cell and the second TCAM cell are coupled to a first search line of the pair of the search lines,
   wherein the first TCAM cell and the second TCAM cell are coupled to a second search line of the pair of the search lines,
   wherein the pair of search lines is arranged between the first TCAM cell and the second TCAM cell,
   wherein the first word line and the second word line are formed using wirings of a first wiring layer, and the first word line and the second word line extend in the first direction such that the first TCAM cell and the second TCAM cell overlap the first word line and the second word line in the planar view,
   wherein the first match line and the second match line are formed using wirings of a second wiring layer provided adjacent to the first wiring layer, and the first match line and the second match line extend in the first direction such that the first TCAM cell and the second TCAM cell overlap the first match line and second match line in the planar view,
   wherein the first word line and the second word line are in parallel with each other, and the first word line and the second word line are disposed between two first wirings to which a first reference potential is supplied,
   wherein the first wirings are formed using wirings of the first wiring layer,
   wherein the first word line and the second word line are disposed between the two first wirings over all areas where the first TCAM cell and the second TCAM cell overlap the first word line and the second word line in the planar view,
   wherein the first match line and the second match line are in parallel with each other, and the first match line and the second match line are disposed between two second wirings to which the first reference potential is supplied,
   wherein the second wirings are formed using wirings of the second wiring layer, and
   wherein the first match line and the second match line are disposed between the two second wirings over all areas where the first TCAM cell and the second TCAM cell overlap the first match line and second match line in the planar view.

2. The semiconductor storage device according to claim 1, comprising a first shield wiring formed using the wiring of the second wiring layer,
   wherein the first match line and the second match line have a part in which the first match line is in parallel with the second match line, and a part where the first shield wiring is provided between the first match line and the second match line.

3. The semiconductor storage device according to claim 1, comprising two second shield wirings formed using wirings of a third wiring layer provided adjacent to the second wiring layer,
   wherein the two second shield wirings are provided on an upper side of the first match line and the second match line.

4. The semiconductor storage device according to claim 1, comprising:
   two second shield wirings that are formed using wirings of a third wiring layer provided adjacent to the second wiring layer and are provided on an upper side of the first match line and the second match line, and
   a signal wiring that is formed using the wiring of the third wiring layer and is provided between the two second shield wirings.

5. The semiconductor storage device according to claim 1, wherein the first word line and the second word line have a part formed using the wiring of the first wiring layer, and a part formed using the wiring of the second wiring layer.

6. The semiconductor storage device according to claim 5, wherein a functional block is formed on a lower side of a part formed using the wiring of the second wiring layer of the first word line and the second word line.

7. The semiconductor storage device according to claim 1, comprising:
   a formation area for a precharge circuit that precharges the first match line and the second match line, and
   a decoupling capacitance arranged between the TCAM array and the formation area for the precharge circuit.

8. The semiconductor storage device according to claim 1, comprising:
   a formation area for a word line driver circuit that drives the first word line and the second word line; and
   a decoupling capacitance arranged between the TCAM array and the formation area for the word line driver circuit.

9. The semiconductor storage device according to claim 1, further comprising:
   a third wiring layer adjacent to the second wiring layer, and
   third wirings,
   wherein the third wiring is wider than the second wring in a second direction perpendicular to the first direction, and
   the third wiring covers the first match line and the second match line in the planar view.

* * * * *